United States Patent
Dinneen et al.

(10) Patent No.: US 9,809,898 B2
(45) Date of Patent: Nov. 7, 2017

(54) ELECTROPLATING AND POST-ELECTROFILL SYSTEMS WITH INTEGRATED PROCESS EDGE IMAGING AND METROLOGY SYSTEMS

(71) Applicant: Novellus Systems, Inc., Fremont, CA (US)

(72) Inventors: Daniel Mark Dinneen, Tigard, OR (US); James E. Duncan, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 853 days.

(21) Appl. No.: 13/928,141

(22) Filed: Jun. 26, 2013

(65) Prior Publication Data
US 2015/0001087 A1    Jan. 1, 2015

(51) Int. Cl.
*G06K 9/00*    (2006.01)
*G01N 21/00*    (2006.01)
(Continued)

(52) U.S. Cl.
CPC .......... *C25D 17/001* (2013.01); *C25D 21/10* (2013.01); *C25D 21/12* (2013.01);
(Continued)

(58) Field of Classification Search
USPC .......... 382/145, 151; 356/237.2; 219/121.68; 438/16, 687; 348/86
See application file for complete search history.

(56) References Cited

U.S. PATENT DOCUMENTS 5,096,550 A    3/1992    Mayer et al.
6,156,167 A    12/2000    Patton et al.
(Continued)

FOREIGN PATENT DOCUMENTS

CN           102428546 A     4/2012
WO    WO 2010/133989    11/2010

OTHER PUBLICATIONS

U.S. Appl. No. 14/160,471, filed Jan. 21, 2014, entitled "Methods and Apparatuses for Electroplating and Seed Layer Detection."
(Continued)

*Primary Examiner* — Kathleen Y Dulaney
(74) *Attorney, Agent, or Firm* — Weaver Austin Villeneuve & Sampson LLP

(57) ABSTRACT

Disclosed herein are electroplating systems for forming a layer of metal on a wafer which include an electroplating module and a wafer edge imaging system. The electroplating module may include a cell for containing an anode and an electroplating solution during electroplating, and a wafer holder for holding the wafer in the electroplating solution and rotating the wafer during electroplating. The wafer edge imaging system may include a wafer holder for holding and rotating the wafer through different azimuthal orientations, a camera oriented for obtaining multiple azimuthally separated images of a process edge of the wafer while it is held and rotated (the process edge corresponding to the outer edge of the layer of metal formed on the wafer), and image analysis logic for determining an edge exclusion distance, wherein the edge exclusion distance is a distance between the wafer's edge and the process edge.

27 Claims, 8 Drawing Sheets

(51) Int. Cl.
*B23K 26/00* (2014.01)
*G01R 31/26* (2014.01)
*H01L 21/44* (2006.01)
*H04N 9/47* (2006.01)
*C25D 17/00* (2006.01)
*H01L 21/67* (2006.01)
*C25D 21/10* (2006.01)
*C25D 21/12* (2006.01)
*H01L 21/02* (2006.01)
*H01L 21/768* (2006.01)

(52) U.S. Cl.
CPC .... H01L 21/67253 (2013.01); H01L 21/0209 (2013.01); H01L 21/02087 (2013.01); H01L 21/76877 (2013.01)

(56) References Cited

U.S. PATENT DOCUMENTS

| | | | |
|---|---|---|---|
| 6,930,782 B1 | 8/2005 | Yi et al. | |
| 7,142,300 B2 | 11/2006 | Rosengaus | |
| 7,423,269 B1 | 9/2008 | Azordegan et al. | |
| 7,449,098 B1* | 11/2008 | Mayer | B23H 5/08 205/118 |
| 7,623,228 B1* | 11/2009 | Muckenhirn | G01N 21/9501 356/237.2 |
| 7,728,965 B2* | 6/2010 | Haller | G01N 21/8806 356/237.1 |
| 7,760,929 B2 | 7/2010 | Orbon et al. | |
| 7,780,867 B1 | 8/2010 | Mayer et al. | |
| 7,787,114 B2 | 8/2010 | Wolters et al. | |
| 7,811,424 B1* | 10/2010 | Woods | C25D 5/06 204/224 R |
| 2003/0022493 A1* | 1/2003 | Jiang | H01L 21/2885 438/687 |
| 2004/0218804 A1* | 11/2004 | Affleck | C30B 7/00 382/141 |
| 2005/0013476 A1* | 1/2005 | Simpkins | G06T 7/0004 382/151 |
| 2005/0122509 A1* | 6/2005 | Backhauss | G01N 21/8806 356/237.2 |
| 2005/0217707 A1* | 10/2005 | Aegerter | H01L 21/31111 134/33 |
| 2005/0280807 A1* | 12/2005 | Backhauss | G01N 21/9503 356/237.2 |
| 2006/0000716 A1 | 1/2006 | Wilson et al. | |
| 2007/0087530 A1 | 4/2007 | Yim et al. | |
| 2007/0139645 A1 | 6/2007 | Shen et al. | |
| 2008/0007726 A1 | 1/2008 | Fairley et al. | |
| 2008/0013822 A1* | 1/2008 | Pai | G01N 21/9501 382/145 |
| 2008/0047827 A1 | 2/2008 | Cheng | |
| 2008/0293333 A1* | 11/2008 | Zhang | B24B 37/042 451/41 |
| 2009/0059236 A1* | 3/2009 | Meeks | G01B 11/065 356/445 |
| 2009/0116727 A1* | 5/2009 | Jin | G01N 21/9503 382/149 |
| 2009/0122304 A1* | 5/2009 | Jin | G01N 21/9503 356/237.4 |
| 2009/0205676 A1* | 8/2009 | Nakagawa | H01J 37/32862 134/1 |
| 2009/0268953 A1* | 10/2009 | Crucs | A61B 6/583 382/128 |
| 2010/0055924 A1 | 3/2010 | Ganesan et al. | |
| 2011/0054659 A1* | 3/2011 | Carlson | G01N 21/9501 700/109 |
| 2011/0103679 A1* | 5/2011 | Campbell | G01B 11/0608 382/152 |
| 2011/0139757 A1* | 6/2011 | Millman, Jr. | B23K 26/0676 219/121.69 |
| 2011/0218762 A1* | 9/2011 | Chen | G01B 11/24 702/167 |
| 2013/0005056 A1* | 1/2013 | Kim | H01L 22/12 438/16 |
| 2014/0079311 A1 | 3/2014 | Amzaleg et al. | |
| 2014/0367267 A1 | 12/2014 | Egan et al. | |
| 2015/0206770 A1 | 7/2015 | Dinneen et al. | |
| 2017/0221740 A1 | 8/2017 | Ranjin et al. | |

OTHER PUBLICATIONS

U.S. Appl. No. 15/011,363, filed Jan. 29, 2016, entitled "Methods and Apparatuses for Estimating On-Wafer Oxide Layer Reduction Effectiveness Via Color Sensing."
US Office Action dated Nov. 10, 2016 issued in U.S. Appl. No. 14/160,471.
US Office Action dated Oct. 19, 2016 issued in U.S. Appl. No. 15/011,363.
Chinese First Office Action dated Aug. 17, 2016, issued in Application No. CN 201410299510.3.
US Office Action dated Mar. 21, 2017 issued in U.S. Appl. No. 14/160,471.
US Notice of Allowance dated Jul. 27, 2017 issued in U.S. Appl. No. 14/160,471.
US Notice of Allowance dated Mar. 30, 2017 issued in U.S. Appl. No. 15/011,363.
US Notice of Allowance [Corrected Notice of Allowability] dated Jul. 13, 2017 issued in U.S. Appl. No. 15/011,363.
Chinese Second Office Action dated Apr. 14, 2017, issued in Application No. CN 201410299510.3.
U.S. Appl. No. 15/640,047, dated Jun. 30, 2017.

\* cited by examiner

ELECTROPLATING AND POST-ELECTROFILL SYSTEMS WITH INTEGRATED PROCESS EDGE IMAGING AND METROLOGY SYSTEMS

FIELD OF THE INVENTION

This disclosure relates to the fabrication of electronic devices, the electroplating and post-electrofill processing of semiconductor substrates, electroplating and post-electrofill processing systems and apparatuses including edge bevel removal apparatuses, and electroplating and post-electrofill processing systems having integrated and/or in situ metrology systems for examining semiconductor wafers during processing.

BACKGROUND

Integrated circuit fabrication typically involves the deposition of one or more layers of conductive metal on the active circuit region of a semiconductor wafer—i.e., the main interior region on the front side of the wafer which is used for the fabrication of IC devices. Electroplating processes are a common methodology which is used to accomplish such metal layer deposition. For example, typical electroplating applications include, but are not limited to, copper Damascene electrofill, electroplating of tin-silver alloys which are recently finding increased use in wafer level packaging (WLP) applications (see, e.g., U.S. Pat. Pub. No. 2012/0138471, entitled "ELECTROPLATING APPARATUS AND PROCESS FOR WAFER LEVEL PACKAGING," hereby incorporated by reference in its entirety for all purposes), and copper electrofill of through-silicon vias (TSVs) (see, e.g.: U.S. patent application Ser. No. 12/193,644, filed Aug. 18, 2008, titled "PROCESS FOR THROUGH SILICON VIA FILING," now U.S. Pat. No. 7,776,741, issued Aug. 17, 2010; and U.S. patent application Ser. No. 12/577,619, filed Oct. 12, 2009, and titled "ELECTROLYTE CONCENTRATION CONTROL SYSTEM FOR HIGH RATE ELECTROPLATING"; each of which is hereby incorporated by reference in its entirety for all purposes).

While the deposition of a layer of conductive metal may be desired within the active circuit region of a semiconductor wafer, such deposition may be undesirable elsewhere, such as the edge bevel region of the wafer—a narrow a region adjacent to the wafer's edge. However, in many IC fabrication processes, before electroplating may be performed, a thin layer of conductive material must first be deposited to serve as a seed for the electroplating operation to follow, and the process commonly used to deposit this seed layer—physical vapor deposition (PVD) via sputtering—can indiscriminately leave conductive metal deposits within the regions of the wafer where they are not desired. Nevertheless, in order to maximize the size of the wafer's active surface region (and thereby to maximize the number of integrated circuits produced per wafer), the seed layer must be sputtered to very near the edge of the semiconductor wafer, and thus it is typically the case that PVD deposited metal not only covers the active surface region, but also coats the entire front edge area outside the active circuit region, as well as the side edge, and to some degree, the backside. Fortunately, after the PVD seed layer is deposited, electrofill of the conductive metal is much easier to control. In some electroplating systems, such control is achieved by employing an electroplating module and electroplating clamshell wafer holder assembly which excludes the electroplating solution from the undesired areas (such as the wafer edge and backside). One example of a plating apparatus that constrains electroplating solution to the wafer active surface is the SABRE™ clamshell electroplating apparatus available from Lam Research Corp., aspects of which are described in U.S. Pat. No. 6,156,167, "CLAMSHELL APPARATUS FOR ELECTROCHEMICALLY TREATING SEMICONDUCTOR WAFERS," which is hereby incorporated by reference in its entirety for all purposes.

The PVD metal remaining on the wafer edge after electrofill is undesirable for various reasons. One reason is that PVD metal layers are thin and tend to flake off during subsequent handling, thus generating undesirable particles. This can be understood as follows. At the front side edge of the wafer, the wafer surface is beveled. Here the PVD layers are not only thin, but also unevenly deposited. Thus, they do not adhere well. Adhesion of subsequent dielectric layers onto such thin metal is also poor, thus introducing the possibility of even more particle generation. By contrast, the PVD metal on the active interior region of the wafer is simply covered with thick, even electrofill metal and planarized by CMP down to the dielectric. This flat surface, which is mostly dielectric, is then covered with a barrier layer substance such as SiN that both adheres well to the dielectric and aids in the adhesion of subsequent layers.

To address these problems, a post-electrofill processing system may be designed to remove PVD deposited and electroplated metal from an edge bevel region of a semiconductor wafer. Such an edge bevel removal (EBR) operation may be performed in a post-electrofill EBR module and oftentimes involves a metal etch of the wafer edge followed by a rinse and dry. In some embodiments, a post-electrofill EBR module may be a part of an integrated electroplating system that performs electroplating (electrofill), post-electrofill etching, and potentially other operations such as cleaning operations, for example.

The precision of the EBR operation is important, however. In particular, it's important that an EBR operation does not remove too little or too much metal from a wafer's edge bevel region and that the removal operation is done evenly—i.e., in a substantially radially symmetric manner. Too little metal removal in the edge bevel region may fail to cure the problems noted above, whereas metal removal too far radially inward on the wafer may consume valuable surface area which could otherwise serve as additional active circuit region used for chip production. In sum, an effective EBR operation works to remove PVD deposited and electroplated metal from the edge bevel region as thoroughly and as radially symmetrically as possible—and over the radially narrowest region which is sufficient to cure the deficiencies noted above in connection with deposited metal in this region of the wafer.

SUMMARY OF THE DISCLOSURE

Disclosed herein are electroplating systems for forming a layer of metal on a substantially circular wafer which include an electroplating module and a wafer edge imaging system. The electroplating module may include a cell for containing an anode and an electroplating solution during electroplating, and a wafer holder for holding the wafer in the electroplating solution and rotating the wafer during electroplating. The wafer edge imaging system may include a wafer holder for holding and rotating the wafer through different azimuthal orientations, a camera oriented for obtaining multiple azimuthally separated images of a process edge of the wafer while it is held and rotated through different azimuthal orientations on the wafer holder of the imaging system (the process edge corresponding to the outer edge of the layer of metal formed on the wafer), and image analysis logic for determining an edge exclusion distance from the multiple azimuthally separated images, wherein the edge exclusion distance is a distance between the wafer's edge and the process edge. The electroplating system may further include fault identification and reporting logic for reporting an error to the operator of the electroplating system when the image analysis logic determines that an edge exclusion distance is outside a predetermined range. In some embodiments, the image analysis logic may determine multiple azimuthally separated edge exclusion distances from the multiple azimuthally separated images, wherein each edge exclusion distance is a distance between the wafer's edge and the process edge at a particular azimuthal angle. The image analysis logic may further include sharpness analysis logic for analyzing images of the process edge and determining the sharpness of the process edge in the images. In some embodiments, the process edge, of which the edge exclusion distance is determined in reference, is chosen for analysis by the image analysis logic based on its location within a predetermined radial range inward from the wafer's edge.

In some embodiments, the image analysis logic may further include concentricity analysis logic for determining that the wafer's edge and imaged process edge are concentric when a metric indicative of the statistical variation in the multiple edge exclusion distances over different azimuthal angles is within a predetermined threshold value and non-concentric when the metric exceeds the threshold value. The metric may be the standard deviation of the edge exclusion distances over different azimuthal angles. The electroplating system may further include wafer centering adjustment logic for adjusting the centering of one or more subsequently processed wafers within the electroplating module when it is determined that the currently imaged wafer's edge and process edge are non-concentric. The electroplating system may further include fault identification and reporting logic for reporting an error to the operator of the electroplating system when the concentricity analysis logic determines that the imaged wafer's edge and process edge are non-concentric.

In some embodiments, the wafer edge imaging system may be configured to operate in multiple imaging modes and to obtain multiple azimuthally separated images of the process edge using the multiple imaging modes, and in certain such embodiments, the wafer edge imaging system may further include an image optimization subsystem for determining an imaging mode which generates the sharpest images of the process edge, and selecting the images generated using that mode for use by the image analysis logic to determine an edge exclusion distance. The wafer edge imaging system may include an illumination subsystem having a light source with adjustable illumination intensity, and wherein the multiple imaging modes comprise distinct combinations of settings for illumination intensity and exposure times. The wafer edge imaging system may further include an illumination subsystem having a diffuse light source for illuminating the wafer's edge with light comprising either diffuse low angle light or diffuse on-axis light relative to the horizontal plane of the wafer's surface. In some embodiments, the image analysis logic of the electroplating system may further include logic for determining a taper width of the process edge from the multiple azimuthally separated images.

In some embodiments, the camera of the wafer edge imaging system may be a color camera, and in certain such embodiments, each of the images generated by the color camera may be represented as an array of pixels, each pixel comprising at least three color values. In some embodiments, in the multiple azimuthally separated images, the process edge is identified as a narrow region having the greatest color contrast between adjacent pixels. In some embodiments, the image analysis logic may further include logic for determining a taper width of the process edge from the multiple azimuthally separated images. In some embodiments, the wafer edge imaging system is configured to operate in multiple imaging modes and to obtain multiple azimuthally separated images of the process edge using the multiple imaging modes. In some embodiments, the wafer edge imaging system further comprises an image optimization subsystem for determining an imaging mode which generates images of the process edge having the highest color contrast between pixels on either side of the process edge, and selecting the images generated using that mode for use by the image analysis logic to determine the taper width. In some embodiments, the wafer edge imaging system may further include an illumination subsystem having a diffuse light source for illuminating the wafer's edge with diffuse low angle light relative to the horizontal plane of the wafer's surface, and in certain such embodiments, the wafer edge imaging system's multiple imaging modes comprises distinct combinations of settings for illumination intensity, and exposure times. The multiple imaging modes may further include distinct settings for color hue, saturation, and intensity.

In some embodiments, an electroplating system having a wafer edge imaging system may further include an edge bevel removal module which includes a wafer holder for holding and rotating the wafer, and a device for delivering etchant to an edge bevel region of the wafer while it is held and rotated on the wafer holder to remove electroplated metal from the edge bevel region after electroplating in the electroplating module. In certain such embodiments, the wafer holder of the wafer edge imaging system may be the wafer holder of the edge bevel removal module. In some embodiments, the camera of the wafer edge imaging system may be a color camera, and each image generated by the color camera may be represented as an array of pixels, each pixel comprising at least three color values. In certain such embodiments, the image analysis logic may further include EBR detection logic for determining from multiple azimuthally separated images whether or not edge bevel removal (EBR) has been performed on the wafer by the edge bevel removal module, and wherein the electroplating system further comprises fault identification and reporting logic for reporting an error to the operator of the electroplating system when the image analysis logic determines that EBR has not been performed. The EBR detection logic may determine whether or not EBR has been performed based on the difference between one or more of the three color values measured by the color camera at one or more pixels measured near the edge of the wafer and one or more stored reference color values indicative of the color at a point on a wafer where a metal layer isn't present. In some embodiments, the electroplated metal is copper.

Also disclosed herein are post-electrofill processing systems for processing substantially circular wafers having an electroplated layer of metal formed on their surface which may include an edge bevel removal module and a wafer edge imaging system. The edge bevel removal module may include a wafer holder for holding and rotating the wafer through different azimuthal orientations, and a device for delivering etchant to an edge bevel region of the wafer while it is held and rotated on the wafer holder to remove electroplated metal from the edge bevel region. The wafer edge imaging system may include a wafer holder for holding and rotating the wafer through different azimuthal orientations, a camera oriented for obtaining multiple azimuthally separated images of a process edge of the wafer while it is held and rotated through different azimuthal orientations on the wafer holder of the edge bevel removal module (the process edge corresponding to the outer edge of the layer of metal formed on the wafer), and image analysis logic for determining an edge exclusion distance from the multiple azimuthally separated images (wherein the edge exclusion distance is a distance between the wafer's edge and the process edge). The wafer holder of the wafer edge imaging system may be the wafer holder of the edge bevel removal module. In some embodiments, the multiple azimuthally separated images may be obtained prior to the wafer's treatment in the edge bevel removal module, and the imaged process edge may correspond to the wafer's plated edge formed by electroplating. In some embodiments, the multiple azimuthally separated images may be obtained after the wafer is treated in the edge bevel removal module, and the imaged process edge may correspond to the wafer's etched edge after treatment in the edge bevel removal module.

Also disclosed herein are methods of processing substantially circular wafers which include performing a processing operation on the wafer which forms a process edge of the wafer, rotating the wafer through multiple azimuthal orientations, obtaining multiple azimuthally separated images of the process edge of the wafer while it is rotated through the multiple azimuthal orientations, identifying the process edge of the wafer in the multiple azimuthally separated images as a region having high contrast between adjacent pixels in the images, determining an edge exclusion distance from the multiple azimuthally separated images by comparing the identified process edge with the wafer's physical edge appearing in the images, and reporting that the edge exclusion distance is outside a predetermined range. In certain such embodiments, the processing operation is electroplating. In other embodiments, the processing operation is edge bevel removal.

DETAILED DESCRIPTION

Figure 1:
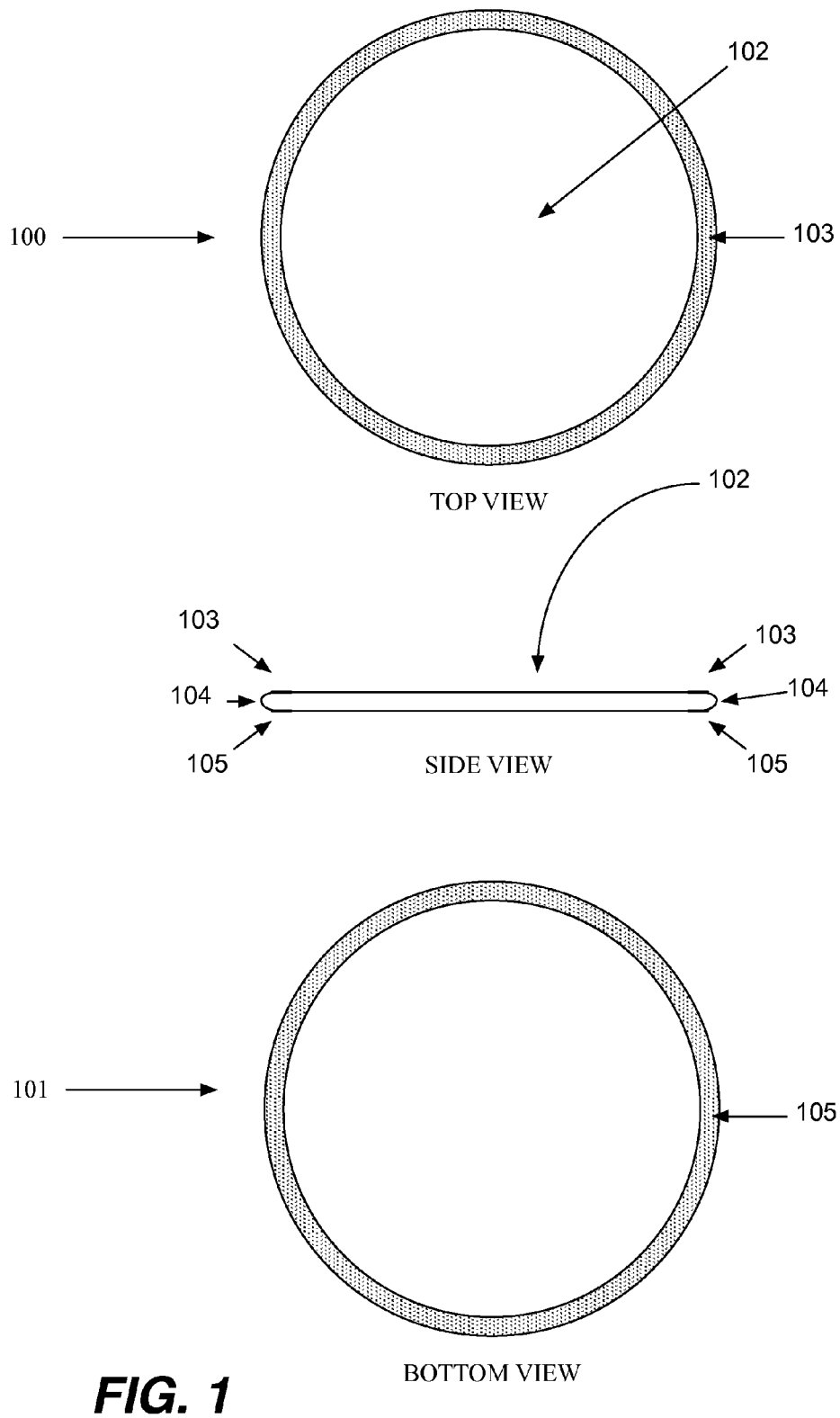
FIG. 1 provides a schematic illustration of a semiconductor wafer.

In the following disclosure, numerous specific embodiments are set forth in order to provide a thorough understanding of the inventive concepts disclosed herein. However, it will be appreciated by those skilled in the art that the inventive concepts disclosed herein may in many cases be practiced with or without certain of these specific details, such as by the substitution of alternative elements or steps, while remaining within the scope and spirit of the inventive concepts disclosed herein. As such, in certain instances, certain well-known processes, procedures, operations, steps, elements, modules, and/or components have not be described in great detail, so as to not unnecessarily obscure the important aspects of the disclosed inventive concepts.

Disclosed herein are integrated and/or in situ metrology tools and imaging systems, and related operations, to be used in the processing of semiconductor wafers in electroplating systems/apparatuses, post-electrofill processing systems/apparatuses, and the like. More particularly, this disclosure pertains to cameras, imaging systems, image optimization subsystems, and methodologies for analyzing the edge exclusion region of a semiconductor wafer, in some embodiments, after an edge bevel removal (EBR) operation has been performed. In some embodiments, these tools, systems, and methodologies may be applied to assessing wafer centering and alignment in an electroplating and/or a post-electrofill processing system. Currently, there is no technology available for accomplishing detailed wafer edge and process edge imaging and analysis in situ. Instead, current practice is to remove a wafer from the wafer processing equipment, transfer it to a separate and distinct metrology area or apparatus (e.g., a microscope), and in this distinct environment away from the processing hardware, image and analyze process performance with respect to the wafer's edge. This practice, however, is inconvenient, slows wafer processing throughput, and eliminates (or at least makes extremely inconvenient) the possibility of closed-loop feedback and adjustment between the imaging and analysis system and the process equipment.

For the reasons described above, an effective EBR operation works to remove PVD deposited and electroplated metal from the edge bevel region as thoroughly and as radially symmetrically as possible—and over the radially narrowest region which is sufficient to cure the deficiencies noted above in connection with deposited metal in this region of the wafer. Accordingly, the alignment and centering of the wafer on the wafer holder/chuck during EBR operations is of prime importance, since if the wafer is not centered then the EBR operation cannot symmetrically remove metal from the wafer edge. Disclosed herein are tools and methodologies for measuring what is referred to herein as the "edge exclusion distance." As described more fully below, the edge exclusion distance is the distance between the (substantially) circular edge of the wafer itself and the wafer's "process edge" which is the outer (substantially) circular edge of the region of the wafer having a layer of electroplated metal thereon. Note that the "process edge" may correspond to the wafer's "plated edge"—the edge of the electroplated region prior to EBR, or it may correspond to the wafer's "etched edge"—the edge of the electroplated region after having been etched back by an EBR operation. Embodiments disclosed herein for measuring the edge exclusion region may use these measurements to assess the concentricity of wafer placement on the wafer holder/chuck and to correct the wafer centering/alignment on subsequent electroplating and/or EBR operations. Embodiments disclosed herein for measuring the edge exclusion distance may use these measurements for other purposes as well, as described in more detail below.

In order to facilitate understanding of the various concepts disclosed herein—including concepts relating to wafer electroplating and electrofill, a wafer's edge bevel region, edge bevel removal (EBR) operations, the concept of an edge exclusion region, and imaging and analysis of the edge exclusion region—FIG. 1 through 6 present various details of certain specific embodiments of electroplating and post-electrofill processing systems and operations. Of course, however, it is to be understood that the level of detail presented below is to provide a specific context for explaining and illustrating the inventive concepts disclosed herein rather than to serve in any manner as a basis for impermissibly limiting those inventive concepts.

First, a schematic illustration of a semiconductor wafer is shown in FIG. 1. As shown, such a semiconductor wafer has a top or "front" side 100 and a "backside" 101. The wafer also has an interior "active circuit region" 102 where integrated circuit devices with associated conductive metal routes are formed, as described above. To make maximum use of expensive semiconductor material, this active circuit region should constitute a high fraction of the area on the front side 100 of the wafer. As shown, integrated circuit wafers also include a "front edge" area 103, which is the region on the front of the wafer that lies outside the active circuit region, a "side edge" area 104 (sometimes referred to herein as an "edge bevel region") and a "back edge" area 105. The side edge lies in the area between the front side and the backside, and the back edge is roughly the area near the outer boundary of the wafer on its backside, approximately analogous to the front edge area. Note that the term "wafer" as used herein includes production pattern wafers, blanket test wafers, or any other types of wafers or substrates processed by semiconductor processing and/or fabrication operations. Thus, in some embodiments, the methods and apparatuses disclosed herein can be used not only in production, but also in pre-production qualification runs and/or for troubleshooting issues related to concentric placement by the robot, concentric plating by the plating cell, and concentric EBR and taper widths and EBR detection in the post-electrofill modules.

An electroplating system is generally a wafer processing system used to form a layer of electroplated metal on a semiconductor wafer via an electroplating operation. A post-electrofill processing system is generally a wafer processing system used to further process semiconductor wafers after having had a layer of metal formed on their surface via an electroplating operation. Oftentimes such systems include an EBR module for performing an EBR operation on an electroplated wafer. The EBR module may also be designed and configured to carry out related operations which may include a backside etch (BSE) and ancillary processes such as pre-rinsing, rinsing, acid washing, and drying. Depending on the embodiment, a post-electrofill processing system may be considered as a subsystem of a larger electroplating system. One such integrated electroplating system is described in detail below in the context of FIG. 3.

While there are many applications of electroplating and post-electrofill processes in the IC fabrication arts (some of which have been listed above), and while generally the disclosed wafer edge imaging concepts and imaging systems may be applied to any of these applications, in order to illustrate a concrete electroplating application, copper damascene electrofill will now be described in some detail with reference to FIG. 2—with the understanding, once again, that such disclosure is intended to be illustrative rather than limiting. The process 200 begins with formation of line paths 201 in a previously formed dielectric layer. These line paths may be etched as trenches and vias in a blanket layer of dielectric such as silicon dioxide. They define conductive routes between various devices on a semiconductor wafer. Because copper or other mobile conductive material provides the conductive paths of the semiconductor wafer, the underlying silicon devices must be protected from metal ions (e.g., copper) that might otherwise diffuse into the silicon. To accomplish this, the process includes depositing a thin diffusion barrier layer 202 before depositing the metal. Suitable materials for the diffusion barrier layer include tantalum, tantalum nitride, tungsten, titanium, and titanium tungsten. In a typical embodiment, the barrier layer is formed by a PVD process such as sputtering.

The wafer is now nearly ready to have its line paths inlayed with the electrofill copper. Before electrofilling, a conductive surface coating is applied. In the depicted process, this is accomplished by depositing a copper seed layer on the barrier layer at 203. A PVD process such as sputtering may be employed to this end. A thicker layer of bulk copper is then deposited over the seed layer 204, typically by electroplating using an electroplating solution. The copper is deposited to a thickness that completely fills the various line paths in the dielectric layer.

During the deposition of PVD copper, deposition in some unwanted areas cannot be avoided. This copper must be removed, and this is accomplished by the edge bevel removal (EBR) and/or backside etch (BSE) processes. With EBR at 205, a copper etchant is applied to the front edge of the wafer in a thin stream. The etchant is typically applied under viscous flow conditions so that it remains in a thin, viscous layer near the point on the wafer where it is applied, and thus avoids splashing the interior of the wafer and removing wanted copper from the active circuit region. It is important for the stream of etchant to apply evenly; otherwise variations in the size of the edge exclusion region may result. A substantially uniform—i.e., concentric—edge exclusion region creates the maximum active and useable surface area. Because the etchant is also generally applied with a radial velocity component, and because of the centripetal acceleration effects of the rotating wafer, the thin viscous layer flows outward, down over the side edge and a few millimeters onto the backside, thus accomplishing removal of the PVD copper from all three of these areas. In most cases, EBR removes the plated film near the edge of the wafer. After EBR, the electroplated copper is planarized, generally by chemical-mechanical polishing (CMP) down to the dielectric at 206 in preparation for further processing (207), generally the addition of subsequent dielectric and metallization layers.

Electroplating Systems

Figure 2:
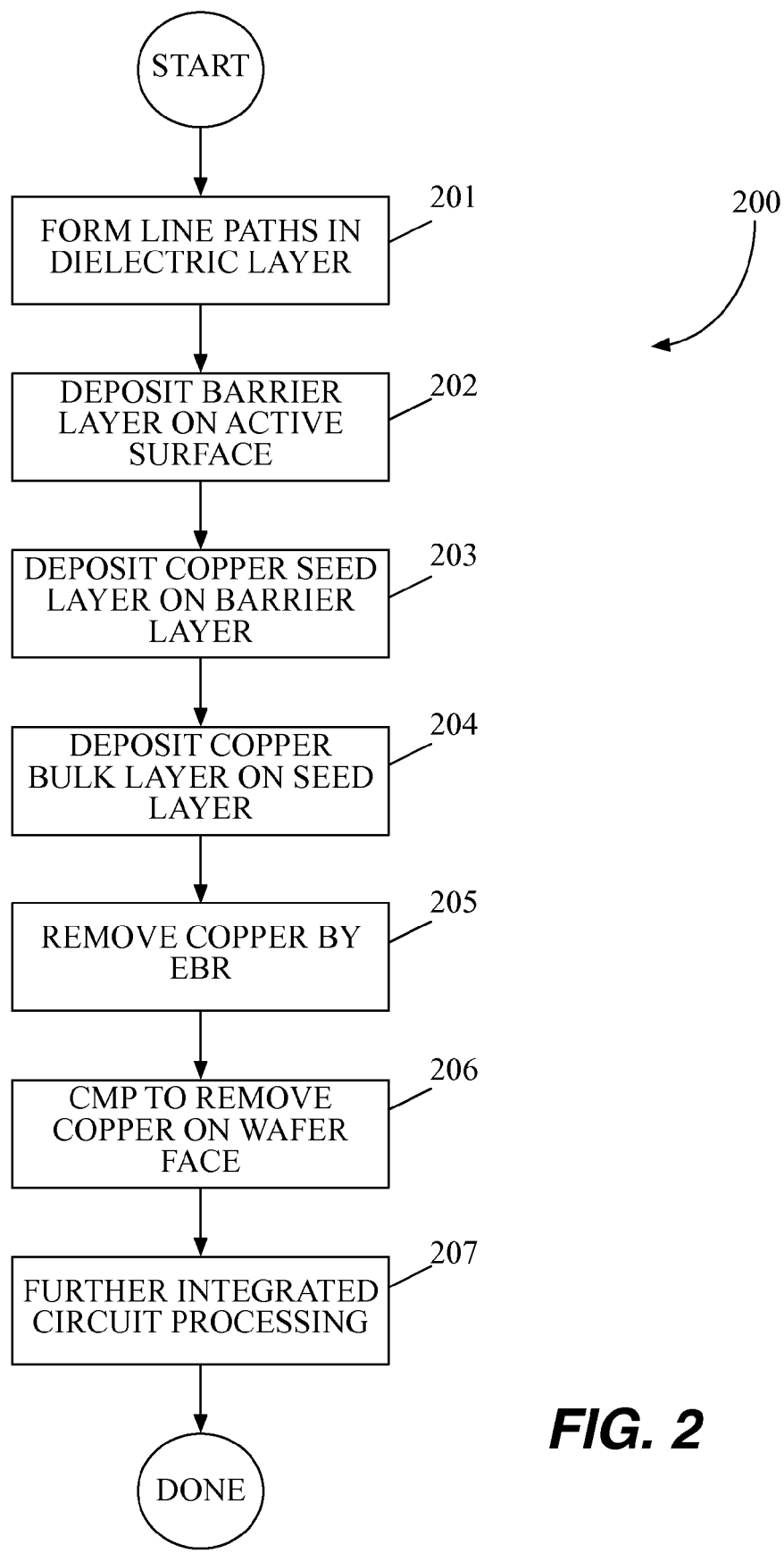
FIG. 2 provides a flowchart of a copper damascene electrofill operation.
Figure 3:
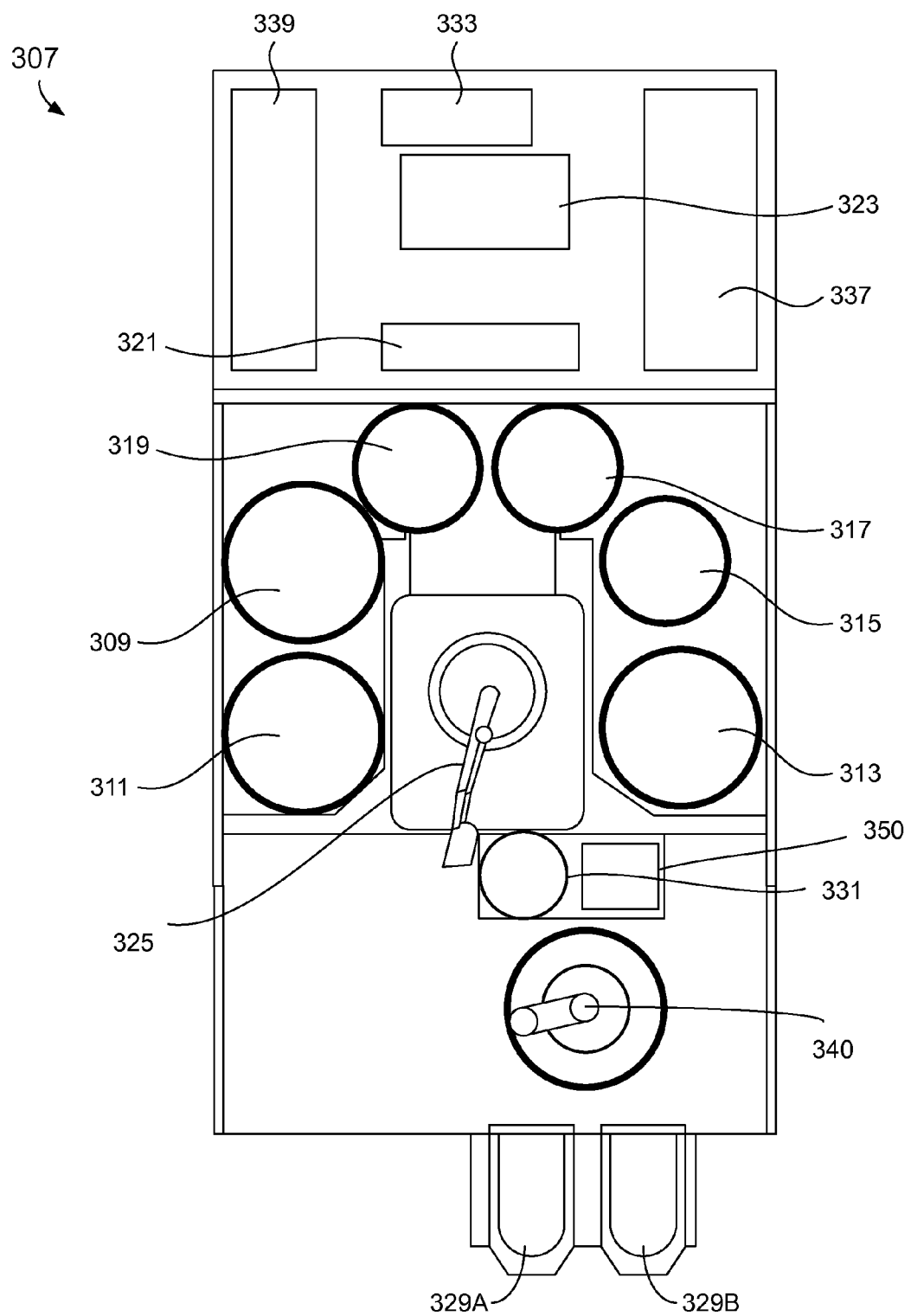
FIG. 3 presents a schematic of one exemplary integrated electroplating system.

FIG. 3 presents a schematic of one exemplary integrated electroplating system which may be used to carry out several of the operations indicated in FIG. 2, in particular, the steps of electroplating 204 and EBR 205. As shown in FIG. 3, an electroplating system 307 may include multiple electroplating modules, in this case the three separate modules 309, 311, and 313. As described more fully below, each electroplating module typically includes a cell for containing an anode and an electroplating solution during electroplating, and a wafer holder for holding the wafer in the electroplating solution and rotating the wafer during electroplating. The electroplating system 307 shown in FIG. 3 further includes a post-electrofill processing system which includes three separate post-electrofill modules (PEMs) 315, 317 and 319. Depending on the embodiment, each of these may be employed to perform any of the following functions: edge bevel removal (EBR), backside etching, and acid cleaning of wafers after they have been electrofilled by one of modules 309, 311, and 313. Note that a post-electrofill module (PEM) which performs edge bevel removal (EBR) will alternatively be referred to herein simply as an EBR module. Electroplating system 307 may also include a chemical dilution module 321 and a central electrofill bath 323. The latter may be a tank that holds the chemical solution used as the electroplating bath in the electrofill modules. Electroplating system 307 may also include a dosing system 333 that stores and delivers chemical additives for the plating bath. If present, the chemical dilution module 321 may store and mix chemicals to be used as the etchant in the post electrofill modules. In some embodiments, a filtration and pumping unit 337 filters the plating solution for central bath 323 and pumps it to the electrofill modules.

Finally, in some embodiments, an electronics unit 339 may serve as a system controller providing the electronic and interface controls required to operate electroplating system 307. The system controller typically includes one or more memory devices and one or more processors configured to execute instructions so that the electroplating system can perform its intended process operations. Machine-readable media containing instructions for controlling process operations in accordance with the implementations described herein may be coupled to the system controller. Unit 339 may also provide a power supply for the system.

In operation, a robot including a back-end robot arm 325 may be used to select wafers from a wafer cassette, such as a cassette 329A or 329B. Back-end robot arm 325 may attach to the wafer using a vacuum attachment or some other feasible attaching mechanism.

A front-end robot arm 340 may select a wafer from a wafer cassette such as the cassette 329A or the cassette 329B. The cassettes 329A or 329B may be front opening unified pods (FOUPs). A FOUP is an enclosure designed to hold wafers securely and safely in a controlled environment and to allow the wafers to be removed for processing or measurement by tools equipped with appropriate load ports and robotic handling systems. The front-end robot arm 340 may hold the wafer using a vacuum attachment or some other attaching mechanism. The front-end robot arm 340 may interface with the cassettes 329A or 329B, a transfer station 350, or an aligner 331. From the transfer station 350, a back-end robot arm 325 may gain access to the wafer. The transfer station 350 may be a slot or a position to and from which front-end robot arm 340 and back-end robot arm 325 may pass wafers without going through the aligner 331. Note, that in some embodiments, the transfer station 350 may serve as (or serve as the location of) a wafer edge imaging module. In some implementations, however, to ensure that a wafer is properly aligned on the back-end-robot 325 for precision delivery to an electroplating module, the back-end robot arm 325 may align the wafer with aligner 331. Back-end robot arm 325 may also deliver a wafer to one of the electrofill modules 309, 311, or 313 or to one of the three post-electrofill modules 315, 317, and 319.

To ensure that the wafer is properly aligned on back-end robot arm 325 for precision delivery to an either an electroplating module 309, 311, or 313, or an EBR module 315, 317, and 319 (assuming these PEMs perform EBR), back-end robot arm 325 transports the wafer to an aligner module 331. In certain embodiments, aligner module 331 includes alignment arms against which back-end robot arm 325 pushes the wafer. When the wafer is properly aligned against the alignment arms, the back-end robot arm 325 moves to a preset position with respect to the alignment arms. In other embodiments, the aligner module 331 determines the wafer center so that the back-end robot arm 325 picks up the wafer from the new position. It then reattaches to the wafer and delivers it to one of the electroplating modules 309, 311, or 313, or EBR modules 315, 317, and 319. In some embodiments, the aligner module 331 may adjust the centering/alignment of the wafer in reference to information about the concentricity of previously plated or etched wafers. In particular, the aligner module 331 may adjust wafer centering/alignment in response to the extent to which a previously plated wafer's process edge is concentric with the edge of the wafer itself, as described in greater detail below. In certain such embodiments, centering adjustment logic may be employed to direct the aligner module 331 via one or more signals. In some embodiments, the aligner module 331 may also be a wafer edge image analysis module as described in greater detail below. In certain such embodiments, such a wafer edge image analysis and aligner module may employ concentricity analysis logic and centering adjustment logic to determine proper centering from the concentricity of the wafer's edge exclusion region and adjust the wafer's centering and alignment accordingly before the wafer is transported onward for further processing.

Thus, in a typical operation of forming a layer of metal on a wafer using the electroplating system 307, back-end robot arm 325 transports a wafer from wafer cassette 329A or 329B to aligner module 331 for pre-electroplating centering adjustment, then to electroplating module 309, 311, or 313 for electroplating, then back to aligner module 331 for pre-EBR centering adjustment, and then to EBR module 315, 317, or 319 for edge bevel removal. Of course, in some embodiments, a centering/alignment step may be omitted. For example, the second alignment (the pre-EBR alignment) may be omitted if wafer alignment generally remains correct subsequent to the first alignment (the pre-electroplating alignment), or alternatively, if alignment during the EBR operation is far more critical, it may be preferable to only perform the pre-EBR alignment. In other embodiments, the wafer may be precisely centered/aligned within one of the EBR modules 315, 317, or 319 itself, without making use of aligner module 331, if the EBR employs a wafer holder capable of centering/aligning the wafer.

As described more fully below, the electroplating operation may involve loading the wafer in a clamshell type wafer holder and lowering the clamshell into an electroplating bath contained within a cell of one of electroplating modules 309, 311, or 313 where the electroplating is to take place. The cell oftentimes contains an anode which serves as a source of the metal to be plated (although the anode may be remote), as well as an electroplating bath solution oftentimes supplied by a central electrofill bath reservoir 323 along with optional chemical additives from a dosing system 333. The EBR operation subsequent to the electroplating operation typically involves removing unwanted electroplated metal from the edge bevel region and possibly the backside of the wafer by way of applying an etchant solution which is provided by chemical dilution module 321. After EBR, the wafer is typically cleaned, rinsed, and dried.

Finally, it is noted that after post-electrofill processing is complete, back-end robot arm 325 may retrieve the wafer from the EBR module and returns it to cassette 329A or 329B. From there the cassettes 329A or 329B may be provided to other semiconductor wafer processing systems such as a chemical mechanical polishing system, for example.

Electroplating Modules

Figure 4:
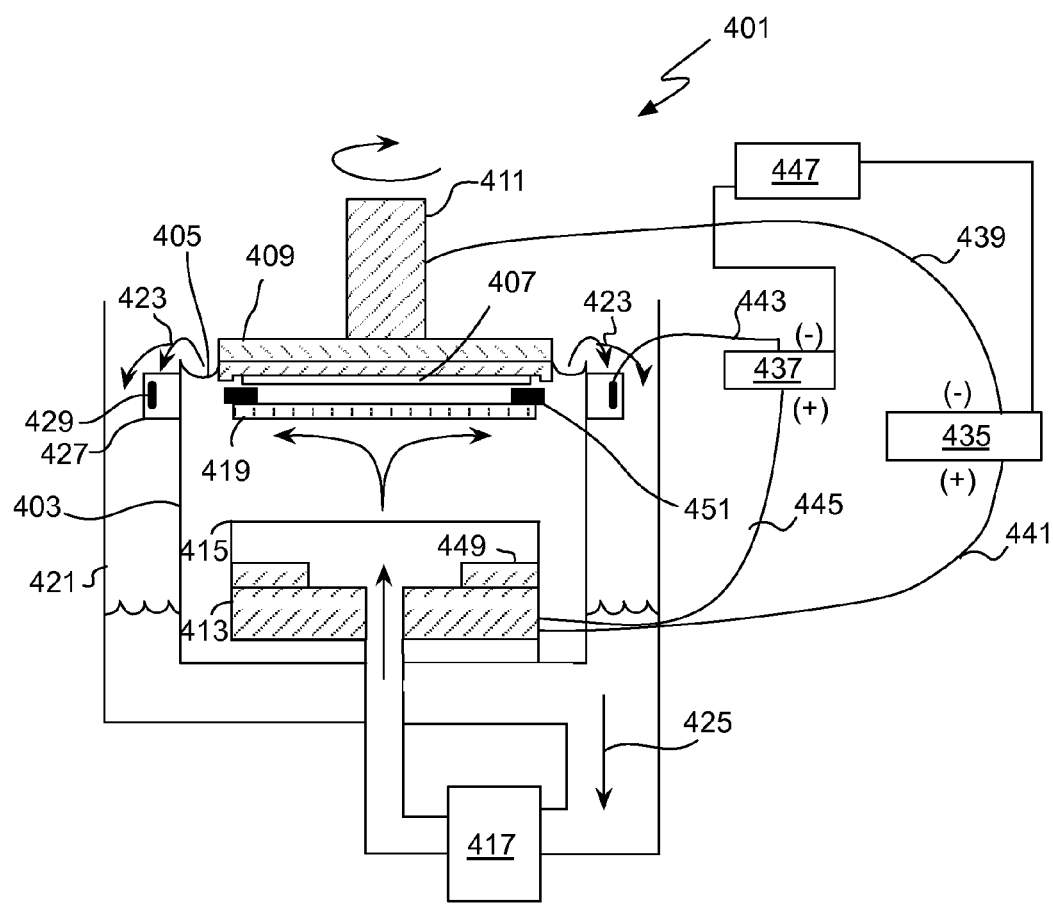
FIG. 4 schematically illustrates a cross-sectional view of an electroplating module.

A specific embodiment of an electroplating module is schematically and cross-sectionally illustrated in FIG. 4. Such an embodiment could serve as any of electroplating system 307's electroplating modules 309, 311, and/or 313 as described above and shown in FIG. 3. Referring again to FIG. 4, the illustrated electroplating module 401 includes an electroplating cell 403 that contains the electroplating solution, which is shown at a level 405. A wafer 407 may be immersed in the electroplating solution while held by a "clamshell" holding fixture 409, the clamshell mounted on a rotatable spindle 411. The rotatable spindle allows for rotation of clamshell 409 together with the wafer 407. Clamshell-type electroplating apparatus are further described U.S. Pat. No. 6,156,167 and U.S. Pat. No. 6,800,187, both of which are hereby incorporated by reference. Of course, wafer holders other than clamshell-type fixtures may alternatively be employed.

An anode 413 is disposed below the wafer 407 within the electroplating cell 403 and is separated from the wafer region by an anode membrane 415, which is an ion selective membrane in some implementations. The region below the anode membrane is often referred to as an "anodic region" or as an "anode chamber" and electrolyte within this chamber as "anolyte," while the region above the anode membrane is often referred to as a "cathodic region" or as a "cathode chamber" and the electrolyte within this chamber as "catholyte." The anode membrane 415 allows ionic communication between the anodic and cathodic regions of the electroplating cell, while preventing any particles generated at the anode from entering the proximity of the wafer and contaminating it. The anode membrane may also be useful in redistributing current flow during the electroplating processes and thereby improve electroplating uniformity. Anode membranes are further described in U.S. Pat. No. 6,126,798 and U.S. Pat. No. 6,569,299, both of which are hereby incorporated by reference.

The electroplating solution may be continuously provided to electroplating cell 403 by a pump 417. Generally, the electroplating solution flows upwards through an anode membrane 415 and a resistive element 419 to the center of wafer 407 and then radially outward and across the wafer. In some implementations, the electroplating solution may be provided into the anodic region of the electroplating cell 403 from the side of the electroplating cell. In some implementations, the electroplating solution may be supplied through separate inlets into anodic and cathodic regions of the electroplating cell 403.

The resistive element 419 is located in close proximity of the wafer (within about 10 millimeters or between about 3 to 8 millimeters, in various embodiments) and serves as a constant current source to the wafer. That is, the resistive element 419 shapes the electrolyte current near the wafer to provide a relatively uniform current distribution over the wafer surface. The element contains a plurality of one-dimensional through holes, as described further below. Further details regarding resistive elements may be found in U.S. patent application Ser. No. 12/291,356, titled "METHOD AND APPARATUS FOR ELECTROPLATING," and filed Nov. 7, 2008, which is hereby incorporated by reference.

After the electroplating solution flows across the surface of the wafer, some of the solution may overflow the electroplating cell 403 to an overflow reservoir 421, as indicated by arrows 423. The electroplating solution may be filtered (not shown) and returned to pump 417, as indicated by arrow 425, completing the recirculation of the electroplating solution.

In some embodiments, such as that shown in FIG. 4, an electroplating module may employ a second cathode chamber 427 containing a second cathode 429 (i.e., a thief cathode) which may be located on the outside of the electroplating cell 403 and peripheral to the wafer 407. Generally, the second cathode 429 may be positioned at a number of locations within the electroplating cell or outside the electroplating cell.

In some embodiments, the electroplating solution overflows a weir wall of the electroplating cell 403 into the second cathode chamber 427. In some embodiments, the second cathode chamber 427 is separated from the electroplating cell 403 by a wall having multiple openings covered by an ion-permeable membrane. The membrane allows ionic communication between the electroplating cell 403 and the second cathode chamber 427, thereby allowing current to be diverted to the second cathode. The porosity of the membrane may be such that it does not allow particulate material to cross from the second cathode chamber 427 to the electroplating cell 403 and result in wafer contamination. The openings in the walls may take the form of rounded holes, slots, or other shapes of various sizes. In one implementation, the openings are slots having dimensions of, e.g., about 12 millimeters by 90 millimeters. Other mechanisms for allowing fluidic and/or ionic communication between the second cathode chamber 427 and the electroplating cell 403 are possible. Examples include designs in which the membrane, rather than an impermeable wall, provides most of the barrier between the electroplating solution in the second cathode chamber 427 and the electroplating solution in the electroplating cell 403. A rigid framework may provide support for the membrane in such implementations.

Two DC power supplies 435 and 437 can be used to control current flow to the wafer 407 and to the second cathode 429, respectively. A power supply 435 has a negative output lead 439 electrically connected to the wafer 407 through one or more slip rings, brushes, or contacts (not shown). The positive output lead 441 of the power supply 435 is electrically connected to the anode 413 located in electroplating cell 403. The power supply may have an output voltage of up to about 250 volts, for example. Similarly, a power supply 437 has a negative output lead 443 electrically connected to the second cathode 429, and a positive output lead 445 electrically connected to the anode 413. Alternatively, one power supply with multiple independently controllable electrical outlets can be used to provide different levels of current to the wafer and to the second cathode.

The power supplies 435 and 437 may be connected to a controller 447, which allows modulation of current and potential provided to the elements of the electroplating module 401. For example, the controller may allow electroplating either in current-controlled or potential-controlled regimes. The controller 447 may include program instructions specifying current and voltage levels that need to be applied to various elements of the electroplating module, as well as times at which these levels need to be changed. For example, it may include program instructions for transitioning from potential-control to current-control upon immersion of the wafer into the electroplating solution.

During use, the power supplies 435 and 437 bias both the wafer 407 and the second cathode 429 to have a negative potential relative to the anode 413. This causes an electrical current flowing from anode 413 to the wafer 407 to be partially or substantially diverted to the second cathode 429. The electrical circuit described above may also include one or several diodes that will prevent reversal of the current flow, when such reversal is not desired. An undesired current feedback may occur during electroplating processes, since the anode 413, which is set at ground potential, is the common element of both the wafer circuit and the second cathode circuit.

The level of current applied to the second cathode 429 is typically set to lower values than the level of current applied to the wafer 407, with the second cathode current being presented as a percentage of the wafer current. For example, a 10% second cathode current corresponds to a current flow at the second cathode that is 10% of the current flow to the wafer. The direction of the current as used herein is the direction of net positive ion flux. During electroplating, the electrochemical reduction of whatever metal is being plated (e.g., $Cu^{2+}+2e^-\rightarrow Cu$) occurs both on the wafer surface and on the second cathode surface, which results in the deposition of the metal on the surfaces of both the wafer and the second cathode. Since the current is diverted from the wafer to the second cathode, the thickness of deposited metal layer at the edge of the wafer may be diminished. This effect typically occurs in the outer 20 millimeters of the wafer, and is especially pronounced in its outer 10 millimeters, particularly when electroplating is performed on a liner layer or a thin seed layer. The use of the second cathode 429 can substantially reduce center-to-edge non-uniformity which typically results from terminal and field effects. A second cathode may be used either alone or in combination with further auxiliary cathodes or with a variety of fixed or dynamic shields. Further details regarding auxiliary cathodes, including secondary and tertiary cathodes, can be found in U.S. patent application Ser. No. 12/481,503, titled "METHOD AND APPARATUS FOR ELECTROPLATING," and filed Jun. 9, 2009, which is hereby incorporated by reference. It should be understood that the secondary/ auxiliary cathode and its associated power supply/supplies as well as any other associated hardware elements are optional features of an electroplating module.

Another optional features of an electroplating module are one or more shields, such as shield 449, which can be positioned within the electroplating cell 403 between the resistive element 419 and the anode 413 (e.g., below the resistive element in wafer-facing-down systems). The shields are usually ring-shaped dielectric inserts, which are used for shaping the current profile and improving the uniformity of electroplating, such as those described in U.S. Pat. No. 6,027,631, which is hereby incorporated by reference. However, other shield designs and shapes may be employed as are known to those of skill in the art, such as shields taking the shape of wedges, bars, circles, ellipses, and other geometric designs. Ring-shaped inserts may also have patterns at their inside diameter, which may improve the ability of the shield to shape the current flux in the desired fashion. The function of the shields may differ, depending on their position in the electroplating cell 403. An electroplating module may include a variety of static shields, as well as a variety of variable field shaping elements, such as those described in U.S. Pat. No. 6,402,923 and U.S. Pat. No. 7,070,686, both of which are hereby incorporated by reference. An electroplating module may also include a variety of segmented anodes such as those described in U.S. Pat. No. 6,497,801, or concentric anodes such as those described in U.S. Pat. Nos. 6,755,954 and 6,773,571, all of which are hereby incorporated by reference. While shielding inserts may be useful for improving electroplating uniformity, they are optional, and alternative shielding configurations may also be employed.

Edge Bevel Removal (EBR) Modules

Figure 5:
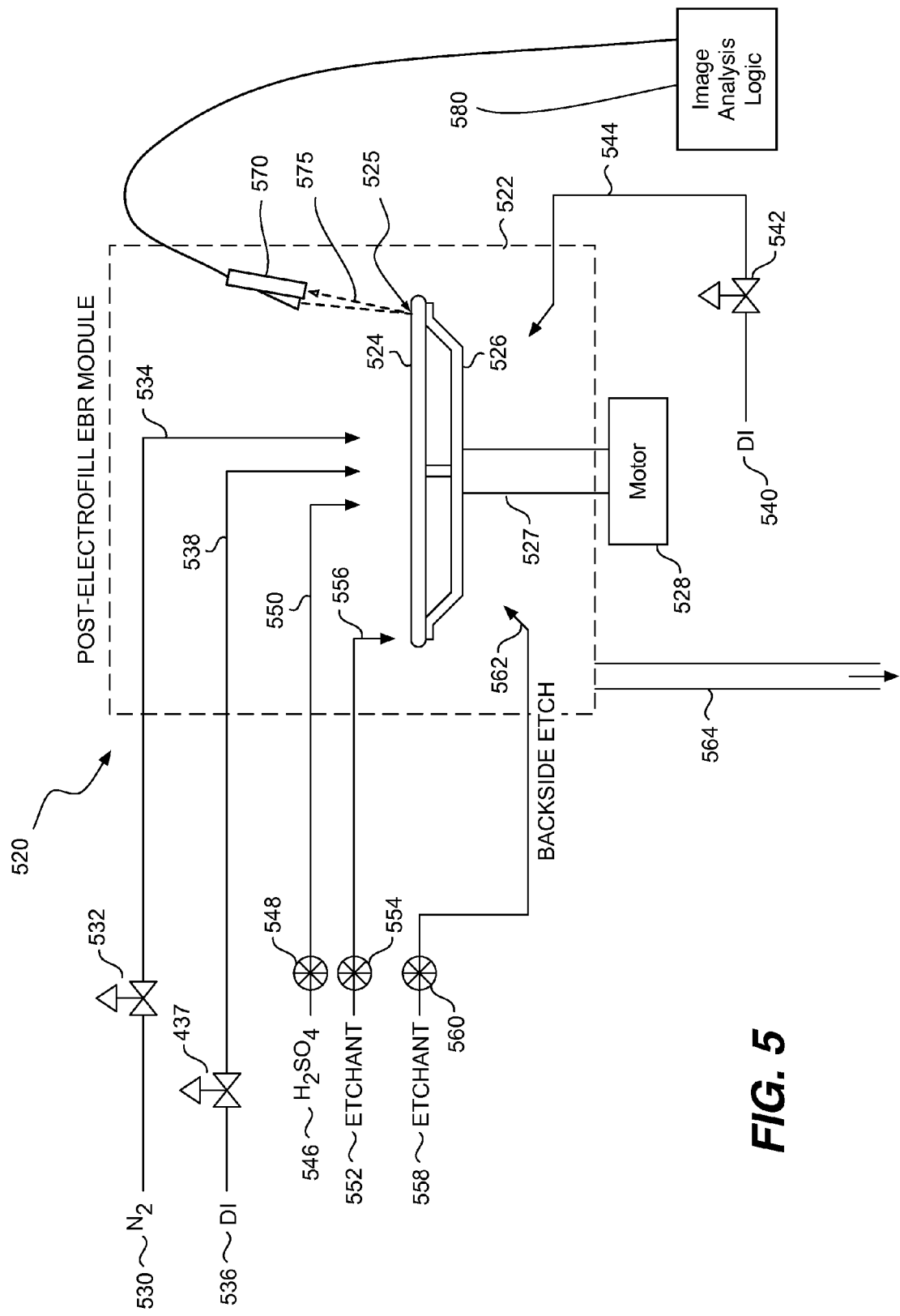
FIG. 5 schematically illustrates an edge bevel removal module integrated a wafer edge imaging system.

A specific embodiment of an EBR module is schematically illustrated in FIG. 5. Such an embodiment could serve as any of electroplating system 307's EBR modules 315, 317, or 319 as described above and shown in FIG. 3. Of course, it could also serve as one or more EBR modules within a stand-alone post-electrofill processing module.

Referring again to FIG. 5, the illustrated EBR module 520 includes a chamber 522 in which a semiconductor wafer 524 rotates. Wafer 524 resides on a wafer holder 526 which imparts rotational motion to wafer 524. Chamber 522 is outfitted with a drain and associated drain line 564. The drain allows the various liquid streams provided to chamber 522 to be removed for waste treatment.

A motor 528 controls the rotation of wafer holder 526. Motor 528 should be easy to control and should smoothly transition between various rotational speeds. It may reside within chamber 522. In some embodiments, to protect against damage from liquid etchant, motor 528 resides outside of chamber 522 and is separated therefrom by a seal through which a rotating shaft 527 passes. Preferably, motor 528 can rapidly accelerate and decelerate (in a controlled fashion) wafer holder 526 and wafer 524 at rotation rates between 0 and about 2500 RPM, or even to about 6000 RPM. In some embodiments, a controller operates and controls the motor and it's rotational speed.

Wafer holder 526 is ideally of a design capable of holding a wafer 524 securely in position while being rotated and accelerated at a variety of rotational speeds ranging from zero RPM to about 6000 RPM. It may also facilitate alignment of wafer 524 for the etching process. Chamber 522 may be of any suitable design that confines the liquid etchant within its interior and allows delivery of the various fluids to wafer 524. It should be constructed of an etchant resistant material and include ports and nozzles for the various liquid and gaseous streams used during etching and cleaning.

Gaseous nitrogen or other non-reactive gas may be provided to post electrofill module 520 from a gas source 530. Nitrogen from source 530 is delivered to chamber 522 under the control of a valve 532 through nozzle 534. The nozzle 534 is typically pointed downward over the wafer 524, as shown in FIG. 5, so as to deliver the nitrogen in a downward direction with an approximately laminar flow to the wafer which may advantageously speed up the drying process. Although a wafer holder 526 during spin/rinse/dry (SRD) may rotate at about 5000 RPM, at that speed turbulence and entrainment is typically too substantial for EBR to be performed. In general, rotation speeds of about 0-2500 RPM, more preferably about 100-1500 RPM, and even more preferably about 500-1300 RPM are effective ranges of rotational speeds for the EBR procedures disclosed herein.

The next input is a source of deionized water 536. The deionized water is delivered to chamber 522 under the control of a valve 537 and through a delivery line and nozzle 538. Note that line and nozzle 538 directs deionized water onto the top of wafer 524. This enables rinsing of the wafer's top side.

A similar deionized water system provides a stream or fan of deionized water to the backside of wafer 524. This deionized water is provided from a source of deionized water 540, which may be the same as source 536. A valve 542 controls the flow of deionized water onto the backside of wafer 524 via a line and nozzle 544. The nozzle associated with 544 may have the same design criteria as just mentioned for nozzle 438. The goal is to rinse etchant from the backside of wafer 524.

An acid rinse may be conducted on the front side of wafer 524. To this end, a source of sulfuric acid 546 provides sulfuric acid to a delivery line and nozzle 550. Other acids may be used as appropriate or combined with sulfuric acid. For example, hydrogen peroxide may be used. Preferably, this module includes a valve that controls the delivery of sulfuric acid to module 520. The flow of sulfuric acid into chamber 522 may be monitored by a flow meter 548. Note that in the depicted embodiment nozzle 550 is oriented to direct sulfuric acid onto the center of the front side of wafer 524. After the acid is delivered to the center of the wafer it then spins out into the edge of the wafer during rotation. This solution is applied to remove residual metal oxide which remains after oxidizing (etching) the wafer and aids in the overall cleaning of the wafer. Only a relatively small amount of acid is typically required (e.g., 0.5 to 2 milliliters/200 mm wafer). After its application, the wafer's front side is rinsed with deionized water through nozzle 538.

Liquid etchant used to remove unwanted metal from the edge bevel region of wafer 524 is provided from a source of liquid etchant 552 as shown. The etchant passes through a flow meter 554 and is delivered to wafer 524 via a line and nozzle 556. Preferably, the etchant is delivered precisely to the edge bevel region of wafer 524 in order to selectively remove metal (e.g., copper) from the edge bevel region whether deposited via PVD or electroplated.

A second liquid etchant stream may be delivered to the backside of wafer 524 in order to etch off any unwanted metal (e.g., copper) that may have been deposited on the backside of wafer 524. As shown, such etchant is delivered from an etchant source 558. Preferably, this is the same source as 552. As shown, etchant from source 558 passes through a flow meter 560 and through a nozzle 562, which directs it onto the backside of wafer 524.

Figure 6:
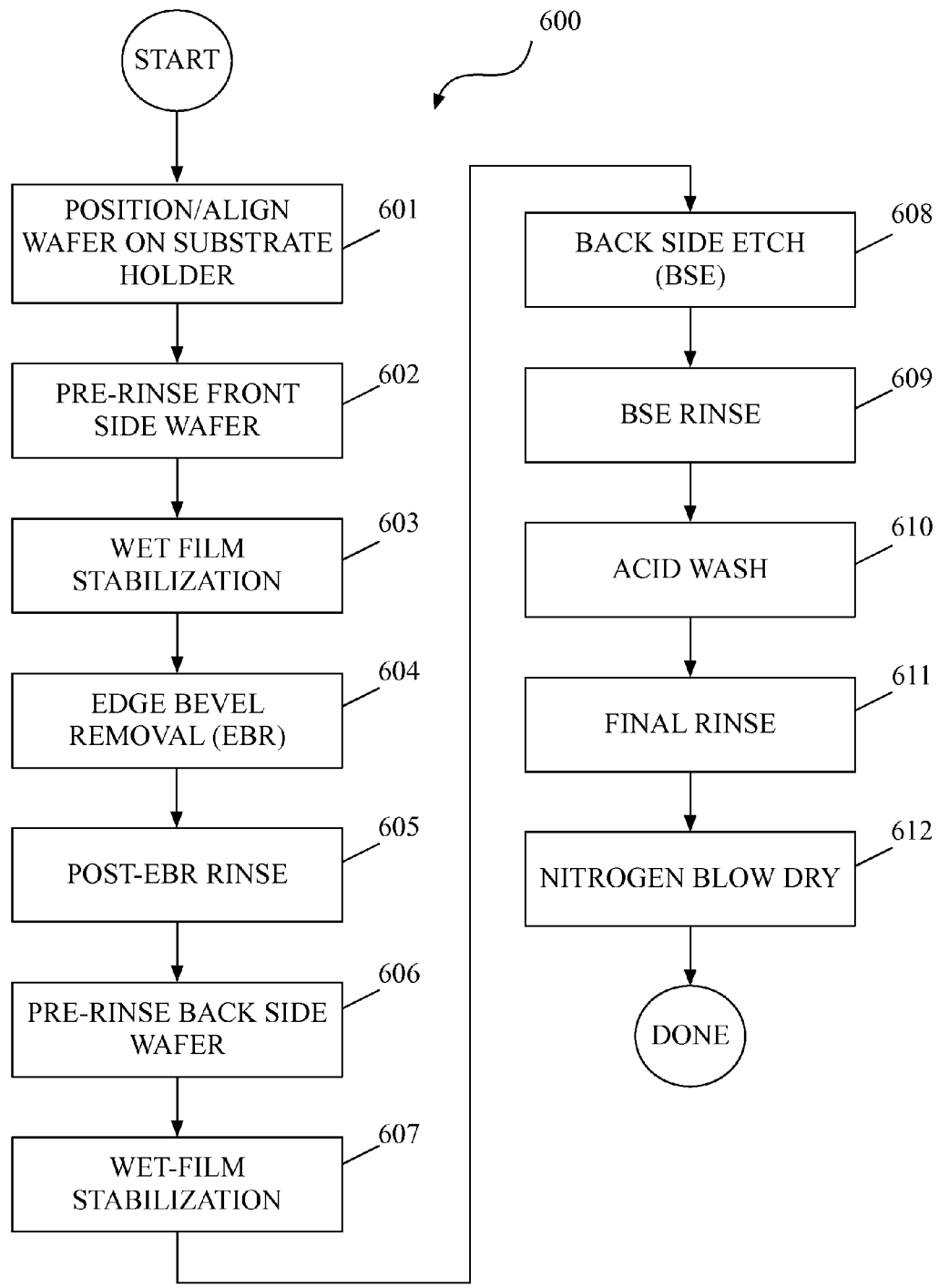
FIG. 6 provides a flowchart of an edge bevel removal operation.

An example EBR process is illustrated in FIG. 6. The EBR process 600 may be carried out via a post-electrofill EBR module, such as module 520 of FIG. 5, that is specifically designed to carry out the EBR process. The process begins at 601, with a robot arm placing the wafer on the substrate holder for EBR processing. The wafer is typically aligned by a number of sloped alignment members and placed on a set of frictional support pins that hold the wafer in place by static friction, even when the wafer is later rotated.

After the robot arm retracts, deionized water is applied to the front of the wafer in step 602 where the wafer is spun at about 200-600 RPM in order to pre-rinse the wafer of any particles and contaminants left over from previous steps. The deionized water is then turned off and the wafer is spun up to a speed of between about 350-500 RPM, which creates a uniformly thin layer of deionized water (wet-film stabilization) 603. This wet-film stabilization facilitates an even distribution of the etchant over the front side of the wafer. At this time, at the latest, any alignment pins or clamps that were used to precisely align the wafer are retracted from the edge of the wafer.

After wet-film stabilization 603, the core feature of the EBR, actual removal of the edge bevel metal 604 is performed. The EBR etchant is typically applied to the surface of the wafer using a thin nozzle tube, which has a nozzle opening at or near its end. In a specific example, an EBR dispense arm is positioned over the wafer edge. Then EBR is performed under the following conditions: a total of about 3 to 15 milliliters etchant is delivered at a rate of about 0.2 to 3 milliliters/second (more preferably about 0.3 to 0.4 milliliters/second) for a 300 millimeter wafer. In some embodiments, the etchant may be dispensed in two or more operations of different flow rates. In a particular example, the 1 ml of the etchant is dispensed at 0.4 ml/sec for a first operation, then 10 ml of the etchant is dispensed at 0.3 ml/sec for a second operation.

After the required amount of liquid etchant has been applied to the edge of the wafer, deionized water is again applied to the front side of the wafer as a post-EBR rinse 605. This application of deionized water will generally continue through the subsequent operations of backside etching and backside rinsing so as to protect the wafer from any extraneous backside etchant spray and damage. While the deionized water is applied, the dispense arm moves the etchant nozzle away from the wafer.

At generally the same time as commencement of step 605, the backside of the wafer is pre-rinsed with deionized water in step 606, which is wet-film stabilized in step 607 in much the same manner that the front side was wet-film stabilized in step 603 (e.g., the wafer rotation speed is held at about 350 to 500 rpm). After the flow of deionized water to the wafer backside ends, a backside etch (BSE) operation 608 is performed—generally with the same etchant that was used for the EBR. In a specific embodiment, a thin jet (initially 0.02 to 0.04 inches in diameter) of liquid etchant is aimed at the center of the wafer backside. The etchant is delivered from a tubular nozzle having a diameter of about 0.02 to 0.04 inches and a length of at least about 5 times the diameter. This etchant then disperses over the entire backside of the wafer. The purpose of the BSE is to remove any residual metal (e.g., copper) that was formed on the backside of the wafer during formation of the PVD deposited seed layer.

The BSE etchant is typically applied using a spray nozzle. Despite gravity, surface tension generally keeps the etchant in contact with the bottom of the wafer long enough to carry out BSE. Since the wafer holder's arms could interfere with the spraying of etchant on the backside of the wafer, the angle of the spray nozzle may be varied during BSE to ensure thorough application of the etchant. Because the wafer is generally held up by support pins that impinge on the backside of the wafer, the process is generally carried out at two different speeds to ensure that the etchant flows adequately over the entire surface. For instance, the wafer may be rotated at about 350 rpm during part of the BSE and then rotated at 500-700 rpm for the remainder of the BSE. The portions of the backside blocked by the arms will differ at the two speeds, thus ensuring complete coverage. Overall, the BSE process typically takes 1-4 seconds and uses 1 to 5 cubic centimeters of the etchant described below to reduce the concentration of metal (e.g., copper) on the backside to less than $5 \times 10^{-10}$ atoms per $cm^2$ of substrate.

After BSE, both sides of the wafer (or at least the backside of the wafer) are rinsed with deionized water in step 609 to rinse away any liquid etchant, particles and contaminants remaining from the BSE. In step 610, the flow of deionized water to the front side ends and about 2 to 4 milliliters of a dilute acid, generally less than about 15% by weight acid, is applied to the front side of the wafer to remove residual metal oxide and remove the associated discoloration. In a specific embodiment, the acid is applied at a rate of about 2 cc/sec. After the acid rinse, deionized water is once again applied in step 611 to both sides of the wafer, or at least the front side, to rinse the acid from the wafer. In a specific embodiment, the deionized water is applied for about 15-30 seconds at about 300-400 milliliters/min. Finally, in step 612, the wafer may be spun and blow-dried, as desired, on both sides with nitrogen. Generally, any drying step is carried out at about 750-2000 RPM for about 10 to 60 seconds, and necessitates a clamping for the wafer once it reaches about 750 RPM. At this point, processing in the post-electrofill EBR module is completed, and so a robot arm picks up the wafer and places it in a cassette for transport onward for additional processing subsequent to the post-electrofill module.

Further information relating to post-electrofill EBR modules and processing operations is disclosed in: U.S. patent application Ser. No. 11/248,874, filed Oct. 11, 2005, titled "EDGE BEVEL REMOVAL OF COPPER FROM SILICON WAFERS," now issued as U.S. Pat. No. 7,780,867; U.S. patent application Ser. No. 11/737,045, filed Apr. 18, 2007, titled "WAFER CHUCK WITH AERODYNAMIC DESIGN FOR TURBULENCE REDUCTION," currently pending; U.S. patent application Ser. No. 12/199,412, filed Aug. 27, 2008, titled "APPARATUS AND METHOD FOR EDGE BEVEL REMOVAL OF COPPER FROM SILICON WAFERS," now issued as U.S. Pat. No. 8,419,964; U.S. patent application Ser. No. 12/394,339, filed Feb. 27, 2009, titled "MAGNETICALLY ACTUATED CHUCK FOR EDGE BEVEL REMOVAL," now issued as U.S. Pat. No. 8,172,646; each of which is hereby incorporated by reference.

System Integrated Cameras and Wafer Edge Imaging Systems

Also disclosed herein are electroplating systems and post-electrofill processing systems which include an integrated camera and wafer edge imaging system. In some embodiments these systems allow for in situ imaging of a wafer's edge and process edge. The camera is oriented within the system so that it may obtain multiple azimuthally separated images of the wafer edge and process edge while the wafer is held and rotated on a wafer holder within the system. Once again, and as defined above, a wafer's "process edge" corresponds to the outer edge of the layer of metal formed on the wafer. As such, the process edge is generally referred to herein as a "plated edge" prior to edge bevel removal (pre-EBR) and as an "etched edge" subsequent to edge bevel removal (post-EBR). Note that in some embodiments, other geometric parameters of the wafer may also be measured and reported: e.g., distance between multiple edges, plated diameter, notch features, etc.

The camera employed may be a high-resolution unit specifically designed for wafer edge imaging, or a suitably configured general-purpose unit, or it may be any one of a number of suitable commercially available color or black-and-white high-resolution cameras, such as those manufactured by Cognex Corp. of Natick, Mass. Whatever camera is chosen for use, it should have the capability of producing images of sufficient resolution, quality, and clarity to distinguish the one or more process edges present on a typical semiconductor wafer's surface near its edge. In one embodiment, a Cognex In-Sight 1740 Wafer Reader Series black-and-white/grayscale camera was employed for in situ wafer process edge analysis. In another embodiment, a Cognex In-Sight 7402C Wafer Reader Series color camera was employed for in situ wafer process edge analysis.

In addition to having a camera, a wafer edge imaging system may also include one or more illumination subsystems. An illumination subsystem may be built into the camera, or it may be a standalone unit, but it typically has a light source with adjustable illumination intensity. In some embodiments, different illumination intensities of the light source may correspond to various modes of the wafer edge imaging system and may be used to optimize image quality, as described below.

Figure 7:
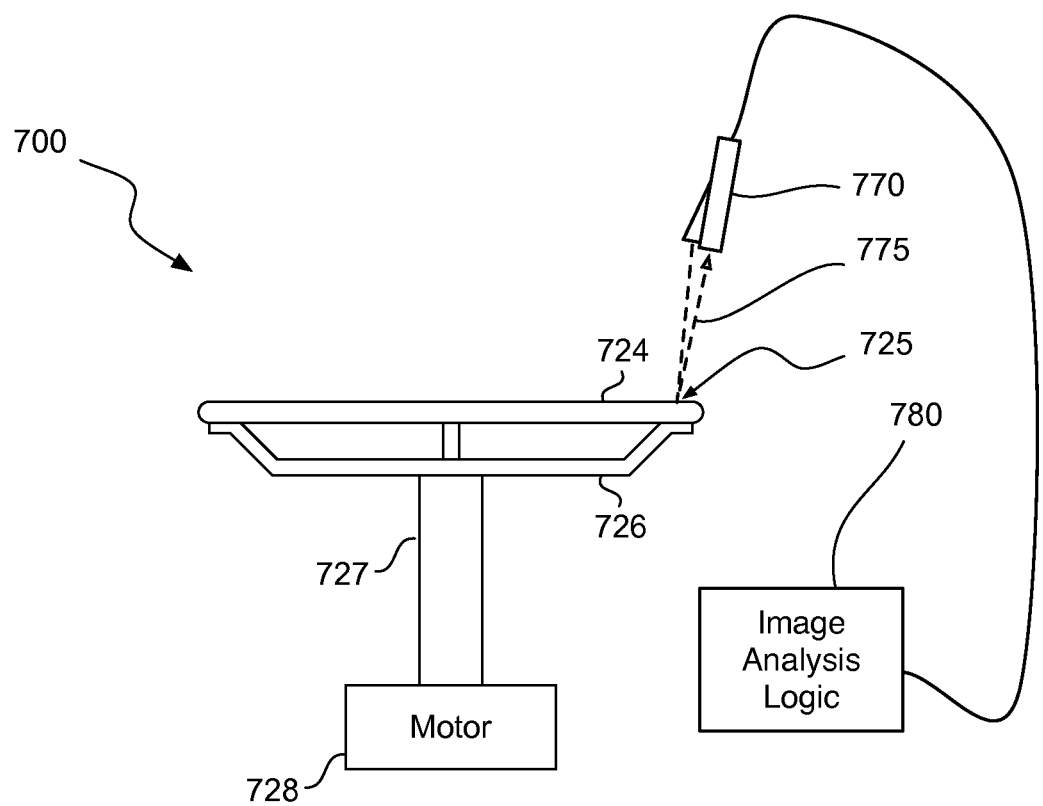
FIG. 7 provides a schematic of a wafer edge imaging system.

The light source may be a colored light source providing illumination over a certain band of wavelengths, or it may be colored light source providing illumination substantially of a specified wavelength (e.g., red, green, blue, etc.), or a substantially white light source. Furthermore, the light source may be diffuse or collimated. In some embodiments, the light source may be used to illuminate the wafer's edge with diffuse low angle light and/or diffuse on-axis light relative to the horizontal plane of the wafer's surface. In some embodiments, the light source may be in the form of a ring of light-emitting units (such as LEDs), the ring being concentric with the lens of the camera. In other embodiments, the light source may be offset slightly from the lens of the camera such as shown in FIGS. 5 and 7 (see camera 570 and 770). Thus, through use of one or more light sources, the illumination subsystem may provide varying degrees of bright field illumination and dark field illumination.

In some embodiments, the wafer is held on a wafer holder and imaged within an electroplating system's or post-electrofill system's EBR module. FIG. 5, discussed in detail above, schematically illustrates such an EBR module 520 having an integrated camera 570 for such purpose. As illustrated in the figure, camera 570 is oriented to image the edge 525 of wafer 524 after illuminating it with light 575. In some embodiments, this may be done at multiple azimuthal positions of the wafer which are provided by rotation of wafer holder 526 by motor 528 and rotating shaft 527. Note, that an EBR module is one type of processing module which may benefit from integration of a wafer edge imaging system, but such a system may also be integrated into other types of modules which would derive a benefit from such an imaging system, and the integration into such modules is also within the spirit and scope of the present disclosure.

In other embodiments, a wafer edge imaging system may be integrated into an electroplating or post-electrofill processing system by way of a distinct stand-alone wafer imaging module. FIG. 7 displays a schematic diagram of such a wafer imaging module 700. Similar to the camera-equipped EBR module shown in FIG. 5, wafer imaging module 700 includes an integrated camera 770 oriented to image the edge 725 of wafer 724 after illuminating it with light 775, and this may be done at multiple azimuthal positions of the wafer which are provided by rotation of wafer holder 726 by motor 728 and rotating shaft 727. The optical subassembly which supports the camera typically includes the camera itself, associated cables and mounting hardware (not shown), etc.

However, in still other embodiments, the features of the wafer imaging module of FIG. 7 may be combined with features of other functional units within an electroplating or post-electrofill processing system. For example, in some embodiments, such as the electroplating system 300 of FIG. 3, a convenient location for performing wafer edge imaging may be within the wafer transfer station 350. This is because all wafers processed by electroplating system 300 will pass through this transfer station module 350 on their way to exiting the system through wafer cassette/FOUP 329A or 329B—the wafers placed at transfer station 350 by back-end robot arm 325 after processing (oftentimes after EBR) and subsequently picked up from transfer station 350 by front-end robot arm 340 for transfer to wafer cassette/FOUP 329A or 329B. Aligner 331 may be another logical place within an electroplating or post-electrofill system to locate the wafer imaging system. This may be because aligner 331 is accessible to all process modules 309, 311, 313, 315, 317, and 319.

In whatever module or functional unit chosen for the wafer edge imaging system, the camera is typically set up at a fixed angle and distance from the wafer edge, and the wafer is rotated so as to bring various azimuthal sections of the wafer's edge into the camera's field of view (FOV). In this manner the entire circumference of the wafer may be imaged without moving the camera. Such an arrangement is illustrated In FIG. 7 by the relationship between camera 770, wafer holder 726, and wafer edge 725.

Image Analysis Logic

As shown in FIGS. 5 and 7, the electroplating and post-electrofill wafer processing systems disclosed herein having an integrated image analysis system typically including image analysis logic 580, 780 for analyzing images of the wafer's edge 525, 725, and its process edge, obtained using camera 570,770. In some embodiments, the image analysis logic 580 may be in direct electronic communication with camera 570,770, as shown in FIG. 7. For example, the image analysis logic may reside on a general purpose computer configured to process images using the image analysis logic, and configured to receive image data from the camera 570,770 through a type of serial or parallel electronic communication mechanism (such as a universal serial bus cable). In other embodiments, the camera itself may contain enough processing power to effectively implement the image analysis logic and apply it to the images of the wafer edge it captures. In some embodiments, the image analysis logic may reside and be applied by the system controller for the entire electroplating or post-electrofill processing system.

The image analysis logic operates on images generated by the camera which may be typically represented as one or more arrays of pixels. In embodiments employing a color camera, the pixels in an array of pixels representing an image may typically include three color values, such as a red, a green, and a blue color value. However, it is of course possible in principle for a camera to generate an image having pixels with more or less than three color values, such as, for example, 1 or 2 or 4 or 5 or 6 or 7 or 8, or 16, or 32, or 64, or 128, or 256 color values, or any number of color values falling within a range of color values defined on the low end and high end by any pair of the aforementioned number of color values. For example, a camera may only detect (or record) red light, and so generate an image as an array of pixels, each pixel only including a red color value indicative of the intensity of red in the image at the point in the image corresponding to that pixel. Similarly, for blue, green, or any other band of wavelengths which may be of interest. Likewise, having additional color values beyond red, green, and blue may provide for greater detection functionality, in some embodiments. For a grayscale camera, each pixel in an array of pixels representing an image recorded with the camera would typically be represented by a single grayscale value indicative of the intensity of light in the image at the location corresponding to the pixel.

In some embodiments, image analysis logic 580, 780 works to determine an edge exclusion distance of the imaged wafer from the multiple azimuthally separated images. The concept of an "edge exclusion distance" is described above and is defined as a distance between the wafer's edge and the wafer's process edge. In some embodiments, the image analysis logic may determine multiple edge exclusion distances at various points around the circumference of the wafer—i.e. at multiple azimuthal angles. In certain such embodiments, each image from the set of multiple azimuthally separated images associated with a wafer may be used to determine an edge exclusion distance which corresponds to the particular azimuthal angle associated with that image. In this manner, the edge exclusion region may be mapped out around the circumference of the wafer from the values of the edge exclusion distance at particular azimuths. In some embodiments, values may be determined at about 400 points around the circumference of the wafer, or between about 300 and 500 points around the circumference of the wafer, or between about 100 and 500 points around the circumference of the wafer. In some embodiments, values may be determined at between about 4 and 25 points around the circumference of the wafer, or between about 10 and 20 points around the circumference of the wafer.

Measurement of the edge exclusion distance (EED) is important because the size of the EED relates to the amount of active surface area available on a wafer—i.e. the part of the wafer which can be used to fabricate microelectronic devices. The smaller the EED, and the more consistently small, the greater the per wafer available active surface area, and the greater the number of microelectronic dies that can be recovered per wafer. Thus, what is often sought is the smallest EED which can consistently be achieved. EED consistency is often expressed in terms of a range. When the process edge is an etched edge formed via EBR, consistency is often expressed in terms of an "EBR range," which is simply the difference between the maximum and minimum values of the EEDs corresponding to the etched edge around the wafer's circumference. EBR range may be viewed as an indicator of EBR edge quality as well as an indicator of concentricity—i.e., lack of concentricity could be indicated by a relatively large value of the EBR range, however, a wafer with a rough or jagged EBR edge might be concentric but still have a relatively large value for its EBR range. Thus, EED measurements are also useful because, in some embodiments, they provide an indicator of the quality of the etched edge formed via EBR. In many cases, for a given batch of semiconductor wafers, there will be a particular predetermined range of EEDs which are expected to be achieved by each wafer undergoing a given electroplating procedure and/or post-electrofill process and, in fact, the overall fabrication process may rely on each wafer's EED falling within that range so that a certain number of dies can be repeatedly recovered from each wafer.

Another important measurement which can be made with respect to the region of a wafer near its edge is a measurement of the wafer's "taper width." When EBR is performed on a wafer to remove unwanted metal from the region near the wafer's edge (as described above), a transition region—referred to as the "taper" region—is typically formed which separates the outer edge region of the wafer where the EBR process has substantially removed all unwanted metal and the interior of the wafer whose metal layer remains essentially unaffected by the EBR process. This taper region is generally sloped—i.e. its surface is not horizontally parallel with the plane of the wafer—because on one side of it a layer of metal has been virtually completely removed whereas on the other side of it virtually no metal has been removed. The width of the taper region—measured in the plane of the wafer—is referred to as the "taper width," and in many instances, it must be tightly controlled in accordance with the various processing operations which follow EBR. In many instances, it is desired to be as small as possible, for the same reason the edge exclusion region is desired to be as small as possible: to maximize the amount of active circuit region (as discussed above). In some scenarios, the taper width may also be an indicator of the quality of the EBR process.

Accordingly, in some embodiments, measurement of taper width may be important in addition to measurement of edge exclusion distance. Thus, image analysis logic 580, 780 may work to determine a taper width of a process edge of the imaged wafer from the multiple azimuthally separated images in addition to an edge exclusion distance. In some embodiments, the image analysis logic may determine multiple taper widths at various points around the circumference of the wafer—i.e. at multiple azimuthal angles. In certain such embodiments, each image from the set of multiple azimuthally separated images associated with a wafer may be used to determine a taper width which corresponds to the particular azimuthal angle associated with that image. In this manner, the taper width (in addition to the EED) may be mapped out around the circumference of the wafer from the values of the taper width at particular azimuths. In some embodiments, values may be determined at about 400 points around the circumference of the wafer, or between about 300 and 500 points around the circumference of the wafer, or between about 100 and 500 points around the circumference of the wafer. In some embodiments, values may be determined at between about 4 and 25 points around the circumference of the wafer, or between about 10 and 20 points around the circumference of the wafer.

Finally, in some embodiments, another important determination which may be made with a wafer edge imaging system is whether EBR has in fact been performed on the wafer being analyzed. It might initially be thought that a determination of edge exclusion distance necessarily implies that EBR has been performed. In some embodiments, this implication may in fact hold, but in the general case, it is not necessarily true: that is, in some situations, image analysis logic may return an edge exclusion distance though EBR has not been successfully performed on the wafer. For example, consider the case of copper electroplating onto a thin layer of copper seed. For various reasons independent of EBR, the electroplated copper will not form a thick layer at the edge of the wafer, and therefore there will be a strong color contrast between the inner region of the wafer where copper has been thickly electroplated and the region at the edge of the wafer where it has not been thickly plated. This color contrast allows an identification and measurement of the process edge, whether or not EBR has been performed to remove the seed layer from the edge. Thus, without further analysis, the process edge may be interpreted as an EBR edge.

Accordingly, various methods and apparatuses are disclosed herein to perform an EBR detect operation in order to determine whether EBR has indeed been performed to remove unwanted metal from the edge of a wafer. In some embodiments, these methods and apparatuses employ a color camera to generate multiple azimuthally separated images of the process edge, and in some embodiments, the image analysis logic 580, 780 may include EBR detection logic for determining from the multiple azimuthally separated images whether or not edge bevel removal has been performed on the wafer. In some embodiments, this determination is accomplished by comparing one or more color values measured near the edge of the wafer, outward of the process edge, with one or more stored reference color values that are known to be representative of the color at the edge of the wafer either before after EBR has been performed.

For example, measured color values which are similar to reference color values measured from a copper seed layer, or dissimilar to reference color values measured from the wafer's surface without seed layer would tend to indicate that EBR has not been performed on the wafer. Likewise, measured color values which are dissimilar to reference color values measured from a copper seed layer, or similar to reference color values measured from the wafer's surface without seed layer would tend to indicate that EBR has been performed on the wafer. Thus, since the images generated by the color camera are typically represented as an array of pixels, each pixel comprising three color values, in some embodiments, the EBR detection logic may determine whether or not EBR has been performed based on the difference between one or more of the three color values measured by the color camera at one or more pixels measured near the edge of the wafer and one or more stored reference color values indicative of the color at a point on a wafer where a metal layer isn't present. Alternatively, the EBR detection logic may determine whether or not EBR has been performed based on the difference between one or more of the three color values measured by the color camera at one or more pixels measured near the edge of the wafer and one or more stored reference color values indicative of the color at a point on a wafer where a metal layer is present. In some embodiments, red, green, and blue (RGB) color values are used for this comparison. In some embodiments, only the red color value is used.

In some embodiments, as an alternative to performing these comparisons via an RBG color space (or color coordinate system), it may be advantageous to utilize a HSI (hue, saturation, intensity) color coordinate system, since colors encountered on plated semiconductor wafers may exhibit greater color differentiation in the HSI color coordinate system compared with the RGB color coordinate system. Note that in an HSI color coordinate system, a color's 'hue' corresponds to its location within the visible portion of the electromagnetic spectrum (red, green, blue, and mixtures/intermediates, etc.), a color's 'saturation' corresponds to the degree to which the color is mixed with grey or white, and a color's 'intensity' is a measure of its brightness defined as the average value of the red, green, and blue color components that make up the color. In some embodiments, use of an HSI color coordinate system may make positive detection of EBR more reliable. In the HSI color coordinate system, isolation and manipulation of the hue parameter has been found to be particularly effective for EBR detection. Note, that in some embodiments, color spaces/coordinate systems other than RBG or HSI may be useful for enhancing color differentiation between the presence or absence of copper seed.

In many cases, if there is an operational problem which causes a wafer's EED to fall outside of an expected predetermined range (or EBR range to be too large, for example), the operator of the processing system would derive a clear benefit from promptly knowing about it. The same may be true if the taper width is outside an expected predetermined range, or if it is determined that EBR has not been performed when it was expected to have been. Accordingly, in order to provide this fault-detection functionality, the disclosed electroplating and post-electrofill processing systems having an wafer edge imaging system and the ability to determine EEDs may, in addition, possess fault identification and reporting logic for reporting an error to the operator of the electroplating system when the image analysis logic determines that an EED is outside a predetermined range of values, and/or when the image analysis logic determines that a taper width is outside a predetermined range of values. Furthermore, in some embodiments, the electroplating system may include fault identification and reporting logic for reporting an error to the operator of the electroplating system when the image analysis logic determines that EBR has not been performed when it was expected to have been.

Note that the EED which triggers the fault reporting may be a mean EED calculated by averaging the individual EEDs measured at each azimuthal angle, or the triggering mean EED may be an average of a subset of the measured EEDs at certain azimuths—perhaps selected because they are azimuthally close to one another, or perhaps selected because they are the N-smallest or N-largest EEDs (where N is a number less than the total number of EEDs). For example, if the average of the 5 largest EEDs exceeds the high-end of the predetermined EED range, the fault identification and reporting logic would report an error to the operator of the processing system. Other types of statistical averaging may also be used. In other embodiments, a single out-of-range EED may trigger fault reporting. In some embodiments, a secondary statistical analysis may be conducted on the data in order to identify anomalous measurements and filter them out—essentially to throw out the statistical outliers. Such a procedure may help to eliminate any false reporting and fault identification. However, if the number of such outlier data points is statistically significant, the fault identification and reporting logic may nevertheless report an error or send an alert to the operator of the processing system.

Similarly, the taper width which triggers the fault reporting may be a mean taper width calculated by averaging the individual taper widths measured at each azimuthal angle, or the triggering mean taper width may be an average of a subset of the measured taper widths at certain azimuths—perhaps selected because they are azimuthally close to one another, or perhaps selected because they are the N-smallest or N-largest taper widths (where N is a number less than the total number of taper widths). For example, if the average of the 5 largest taper widths exceeds the high-end of the predetermined taper width range, the fault identification and reporting logic would report an error to the operator of the processing system. Other types of statistical averaging may also be used. In other embodiments, a single out-of-range taper width may trigger fault reporting. In some embodiments, a secondary statistical analysis may be conducted on the data in order to identify anomalous measurements and filter them out—essentially to throw out the statistical outliers. Such a procedure may help to eliminate any false reporting and fault identification. However, if the number of such outlier data points is statistically significant, the fault identification and reporting logic may nevertheless report an error or send an alert to the operator of the processing system.

Concentricity Analysis Logic and Centering Correction

An electroplating or post-electrofill processing system's wafer edge imaging system may further include concentricity analysis logic for determine whether at to what extent a wafer's process edge is concentric with the edge of the wafer itself. In some embodiments, this additional processing logic may form a subpart of its image analysis logic 580, 780, or it may be a stand-alone logic component in communication with the image analysis logic. Of course, the image analysis logic may be integrated into the camera itself (as described above), and thus the concentricity analysis logic may also be integrated into the camera itself. Furthermore, as described above, in some embodiments, both logic components may be loaded as software instructions on the camera itself, or onto a general purpose computer, or onto the main/central controller of the electroplating and/or post-electrofill processing system.

There are a variety of approaches that the concentricity analysis logic may employ to assess whether the wafer's edge and process edge are concentric with respect to one another. Generally, the concentricity analysis logic assesses concentricity by analyzing a set of multiple edge exclusion distances (EEDs) corresponding to different azimuthal angles around the circumference of the wafer. These would typically be measured/computed by the image analysis logic as discussed above. A wide spread in the EEDs going around the circumference of the wafer is indicative of a non-concentric process edge, and particularly so if values on one side of the wafer tend to be very different than values on the opposite side of the wafer, whereas a narrow range of EEDs is indicative of a concentric process edge. Thus, in some embodiments, a quantitative metric indicative of the statistical variation in the multiple EEDs over different azimuthal angles may be indicative of the concentricity—when the metric is within a predetermined threshold value the process edge may be said to be concentric, and when it exceeds the threshold, the process edge may be said to be non-concentric. Again, the process edge could correspond to a plated edge post-electroplating, or an etched edge post-EBR, depending on the embodiment. A variety of choices are possible for the quantitative/statistical metric. The metric may be the standard deviation of the EEDs over all the different azimuthal angles, or the difference between EEDs on opposite sides of the wafer, averaged over all the azimuthal angles, etc.

Of course, process edge concentricity is important in integrated circuit fabrication because a non-concentric process edge likely means wasted valuable wafer surface area and lower per wafer die yield. Potentially worse yet, if the evaluated process edge is a post-EBR etched edge, lack of concentricity may indicate the wafer was misaligned during EBR and that EBR may not have been achieved at certain azimuthal regions of the wafer edge. An incomplete EBR would implicate all the problems discussed above with respect to the motivations behind performing EBR in the first instance. Accordingly, since it is beneficial for the operator of these disclosed electroplating and post-electrofill processing systems to know immediately when a processing step has gone awry, some embodiments disclosed herein may include fault identification and reporting logic for reporting an error when the concentricity analysis logic determines that the imaged wafer's edge and process edge are non-concentric.

Even more useful in certain cases, is to correct wafer centering in subsequent process steps, when it has been established that wafer centering in a previous process step was less than ideal. The subsequent process step could be, for example, the next process step in the sequence of operations being performed on the wafer that was determined to be misaligned, or it could be, for example, the same process step whose alignment was off performed on a subsequent wafer. Accordingly, to provide a closed-loop wafer misalignment detection and correction mechanism, wafer centering adjustment logic may be included in some of the electroplating systems and post-electrofill processing systems disclosed herein. This centering adjustment logic typically responds to signals or communications from the concentricity analysis logic, and works to adjust the centering of one or more subsequently processed wafers within the electroplating module or edge bevel removal module or other wafer processing module when it is determined that a previously imaged wafer's edge and process edge are non-concentric.

In some embodiments, the centering adjustment is made by making a correction to the next robot handoff to the electroplating module or EBR module or other processing module to restore concentric placement. For example, referring to FIG. 3, back-end robot arm 325 may make a centering adjustment when picking up the next wafer from aligner 331, or when delivering that subsequent wafer to one of the electroplating modules 309, 311, or 313 or to one of the EBR modules 315, 317, or 319. In sum, the capability of making edge exclusion distance measurements in situ and evaluate process edge concentricity while electroplating operations (and post-electrofill operations) are being performed substantially increases the probability of identifying serious issues early on in running a sequence of wafers (i.e., before a significant number of wafers are run and potentially damaged) and by enabling mechanisms within the process system to make minor centering and alignment corrections to wafer placement while production is underway.

Details of Process Edge Detection, Taper Width Measurement, EBR Detection, Imaging System Calibration, and Optimal Mode Selection Despite the utility of having system integrated metrology tools for wafer edge and process edge imaging, image analysis of the process edge can be extremely challenging to implement and, in particular, to implement in a semi or fully automated fashion. Furthermore, since the edge exclusion distance (EED) is the distance between the process edge and the wafer edge, any failure of the image analysis logic to correctly identify and measure the process edge will result in erroneous values of the EED and potentially an erroneous assessment of wafer centering.

One method for detecting a process edge in an electronic image of a wafer is to look for a ring shaped boundary between two concentric regions of the wafer's surface having sharply differing optical properties. For instance, a curved arc-shaped boundary near the wafer's edge separating a highly reflective region from a less reflective region is a potential candidate for identification as a process edge. Looking at it another way, process edge identification may involve searching for narrow regions on the wafer surface where there is sharp optical contrast. Accordingly, in some embodiments, the image analysis logic of a wafer edge imaging system may specifically include logic for sharpness analysis which may be used to identify potential process edge candidates as sharp arc-shaped boundaries in a wafer image which are near but radially inward of the wafer's edge. Sharpness logic may include, for example, logic for differencing the brightness levels of adjacent or nearby pixels, calculating a numerical spatial derivative of brightness level, a brightness gradient, etc. over appropriate regions of an image to estimate the sharpness of each pixel's contrast relative to adjacent or nearby pixels, grouping the sharp high-contrast pixels, and then determining whether the grouped pixels form an arc-shaped line which is nearly concentric with the wafer's edge. Sharpness logic may thus include logic for identifying sharp edges in wafer images.

In embodiments employing a color camera, color may serve as a basis for process edge identification, and identification of the process edge may entail searching for regions of sharp color contrast in the image. For example, if the process edge to be identified and measured is the edge of a layer of copper which has been electroplated onto a wafer, the plated copper covered surface of the wafer will have a substantially different color (it is copper colored) than the unplated surface (which is not copper colored). Thus, in certain embodiments, the process edge may be identified as a narrow region having the greatest color contrast between adjacent pixels, such as for example, in the case of the process edge being an edge of plated copper, a region of the image where there is a distinct change from copper color to non-copper colored. Such identification may also take into account the shape of the region having strong color contrast, for example, by considering whether the pixels so identified map out a curved arc-shaped boundary akin to the shape of a process edge one would expect to find. In some embodiments, the radial position of the boundary may also be taken into account, such as, for example, when it is expected that the process edge be found within some particular radial region of the wafer surface.

Color can also be used to measure the taper width of a process edge at various azimuthal points around the edge of the wafer (as taper width was described above). Where it can be said that a process edge has an associated taper width, implicit in this understanding is the point that process edge itself is not just an edge but a region of the wafer itself, albeit a narrow region. Moreover, it is a region which oftentimes has a color or brightness which is distinctly different than the central region of the wafer inward of the process edge and the edge region of the wafer outward of the process edge. For instance, if the process edge is the edge of a layer of plated copper, as its thickness tapers from its most radially inward point where its thickness matches the layer of plated copper to its most radially outward point where its thickness is essentially zero, its color will attenuate as well from that of the copper color of the plated copper layer to the color of the wafer surface underneath the copper layer. Accordingly, quantification of this color change over the span of a sequence of pixels can be used to estimate the width of this tapering region—i.e. the "taper width." In addition, as described above, the taper region generally has a non-zero slope relative to the horizontal plane of the wafer and so depending on the angle of the incident light and the position of the camera, its reflectivity will differ in this regard as well. With respect to this later point, if the slope of the taper region effects the overall reflectivity enough, in some embodiments, it may be possible to measure the taper width using a grayscale camera and relying on the difference in reflected brightness alone. In some embodiments, this may be done using a grayscale camera under low angle illumination.

Nevertheless, there are significant technical difficulties associated with performing an image analysis to accurately detect and measure a wafer process edge. A first factor contributing to the difficulty is the common presence of a multitude of different process edges simultaneously residing near the edge of a wafer, each resulting from previous processing steps. Although many may be present, only one process edge is intended to be measured at a time, which creates a challenge for an automated (or semi-automated) protocol for identifying the process edge of interest and evaluating its distance from the wafer's edge at a particular azimuthal angle. The result is that, in many instances, the desired process edge is not found, or another is mistakenly identified by the automated protocol, or, in some instances, certain features of the wafer's lithographic patterning may itself falsely be interpreted as a valid process edge.

To deal with this problem of multiple process edges, some methods may target the process edge of interest by using some type of spatial basis for identifying it. Specifically, if it is known beforehand, in terms of a radial range, how close to the wafer edge the process edge is expected to be found, candidates outside of this range may be disregarded. In many instances, the expected range of valid radii is narrow enough than this sort of spatial filtering may unambiguously identify the process edge of interest. In other embodiments, an alternative technique for distinguishing the process edge of interest may be to locate each potential process edge in the image, calculate the contrast in reflectivity between the regions on either side of it, and identifying the correct process edge as that having a contrast which is closest to some predetermined value expected to be found.

A second factor contributing to the difficulty associated with identifying and measuring the process edge relates to the general optical properties of the wafer itself. Semiconductor wafers from different manufacturers typically have very different reflective optical properties due to the vastly varying proprietary lithographic patternings typically etched into their surfaces. These geometric patterns may also result in a single wafer having vastly different optical reflectivity depending on the angle at which it is viewed or imaged. That is, a wafer's optical properties may have a significant angular dependence, and thus each azimuthal portion of the wafer's edge may result in a generated image having somewhat different reflectivity and other optical properties. Dealing with this intrinsic variation may be challenging.

Thus, techniques and systems are desired for handling the intrinsic optical variation between wafers of different lithographic patternings—techniques and systems which, despite the variability, consistently identify and measure the correct process edge. One approach found to be effective for handling wafer variability is to (i) calibrate the wafer edge imaging system for a given set of wafers having a common lithographic patterning, and then (ii), once the system is calibrated, use multiple camera imaging modes to capture multiple images of the wafer's edge, score the images according to a predetermined criteria (as discussed below), and finally choose the highest scoring images for use in process edge identification and measurement. Ideally, as much as possible of the calibration and multi-imaging steps are performed in an automated fashion. Depending on the embodiment, the camera may be a black-and-white/grayscale camera, or the camera may be a color camera.

Accordingly, disclosed herein are electroplating and post-electrofill processing systems whose wafer edge imaging systems employ an image optimization subsystem. In some embodiments, these systems may first be calibrated using a particular type of pattern wafer, and then as wafers are imaged during processing, the image optimization subsystem may work to further optimize the imaging procedure by analyzing the images generated using the multiple imaging modes and determining and selecting the mode which yields the best imagery. In some embodiments, the initial calibration of the imaging system may involve testing various camera positions and orientations—i.e., varying the distance between the camera and the wafer's edge and varying the camera's optical angle—the angle the camera makes with respect to the wafer's normal vector (the vector normal to the horizontal plane of the wafer). The different positions and orientations may each be tested with a suite of camera imaging modes, for example, by toggling the camera through various light-field and dark-field imaging modes. The camera may then be locked into the position and orientation with respect to the wafer which yields the best imagery, thereby completing the calibration. Typical ranges of camera-wafer distances and optical angles which have been found to be effective include: distances of between about 5 and 100 mm, or between about 5 and 80 mm, or between about 5 and 50 mm; and optical angles of between about 0 and 90°, or between about 0 and 30°, or between about 0 and 20°. Criteria for determining what constitutes the best imagery is described in greater detail below. As a further optimization, in some embodiments, the various imaging modes of the camera may be evaluated on the test wafer as well so as to eliminate, at the calibration stage, imaging modes which perform poorly on a particular class of pattern wafers, and to preselect those that perform well.

Once calibrated, camera position and orientation typically do not require further adjustment for a given class of pattern wafers. Moreover, in some cases, the same calibration of camera position and orientation may work well over many different classes of pattern wafers. This is because, to a certain extent, the initial calibration is designed to compensate for any variability in the camera itself as well as any variability in its illumination subsystem, and these factors are, of course, not dependent on what wafers are being analyzed by the system. For example, some cameras have an LED-based illumination subsystem wherein the LEDs are mounted on printed circuit boards, and this results in a certain amount of angular variability to the lighting produced by various on-axis illumination modes when comparing one camera to another. Although the angular variation is typically less than a degree, this is still significant enough to warrant calibration. Thus, in some embodiments, calibration of camera position and angular orientation may compensate for this variability, and this compensation would tend not to be affected by which particular type of pattern wafer is being imaged. Of course, it is to be understood, however, that such calibration is not necessarily required in all embodiments, for example, if the lighting of a given embodiment does not exhibit such angular variability.

After calibration, the wafer edge imaging system is configured to operate effectively on a given class of pattern wafers using the multiple preselected imaging modes. Thus, at this point, to effectively identify and measure the particular process edge of interest at various azimuthal positions around the circumference of the wafer: the camera of the imaging system obtains imagery in each of the preselected imaging modes at multiple azimuthal angles, and then the image optimization subsystem (of the imaging system) scores the images based on a predetermined selection criteria to determine the best imaging mode or modes, and finally selects the images generated using the highest scoring mode (or modes) for use by the image analysis logic to detect, identify, and measure the process edge, and to determine an edge exclusion distance, and also, in some embodiments, to determine a taper width. In some embodiments, the score associated with each image/mode may be based on the sharpness of particular visible features in the wafer edge imagery, which has been found to be an important criteria for choosing the optimal imaging mode or modes. In particular, in some embodiments, the feature used to score the images/modes may be a process edge (or something potentially identifiable as a process edge)—and even more particularly, the process edge of interest. In some embodiments which employ a color camera, the score associated with each image/mode may be based on the degree of color contrast exhibited between pixels on either side of the process edge. The imaging mode or modes which generate images exhibiting the highest color contrast may be selected for use by the image analysis logic to determine the taper width and/or the edge exclusion distance.

Of course, the idea of the scoring criteria is to evaluate a particular imaging mode's ability to enable the system to positively identify and measure the process edge of interest. Note, that in some embodiments, rather than acquiring images using all available modes and selecting the images or modes with the highest scores after the fact, the images may be scored as they are acquired, and once images are found whose scores exceed a predetermined threshold, imaging is concluded and these images are used for wafer edge analysis.

Thus, in some embodiments, the image optimization subsystem may obtain images using different imaging modes, evaluate image sharpness and/or color contrast, or the sharpness and/or color contrast of particular features such as the process edge of interest, as described above, of the various images, and then score the images/modes accordingly. As a result, in some embodiments, the image used by the image analysis logic to determine the edge exclusion distance and/or taper width at a particular azimuth is essentially the image acquired which contains the sharpest representation of the desired process edge and/or the representation exhibiting the highest color contrast.

Note that in some embodiments, the optimal imaging mode may be determined on a per-wafer basis by the image optimization system, and thus, once optimally determined, the same imaging mode is used to image and analyze all points around the circumference of the wafer. In other embodiments, the optimal mode may be allowed to vary on an imaged-point-by-imaged-point basis around the circumference of the wafer, and thus different imaging modes may be optimally chosen for different azimuthal wafer orientations. Analytically, this type of variable optimization may deal with the variable reflectivity one finds by rotating the wafer and imaging it at different azimuthal angles.

Regarding the various imaging modes of the wafer edge imaging system, each is generally characterizable by its predetermined settings for various image capture and illumination parameters. For example, in some embodiments, exposure time may be an important image capture parameter which has a significant effect on the sharpness and/or color contrast of the process edge appearing in the resulting wafer edge images and how precisely a process edge may be identified and measured. In addition, though not camera settings per se, the camera's distance from the process edge, as well as the camera's optical angle, are also parameters which can have a strong effect on the quality of resulting imagery, and so these may also be considered as image capture parameters associated with particular operating modes of the camera. However, as described above, camera position and orientation are typically set and fixed during the initial calibration stage and not adjusted during wafer-by-wafer processing—though this could be done, in principle.

Illumination parameters are also important. In some embodiments, the wafer edge imaging system may include an illumination subsystem having a light source such as a lamp, flash, etc.; or any of the light sources described above, such as a ring of LEDs (light emitting diodes) concentric with the lens of the camera, for example. In some embodiments, the light source may be a diffuse light source having various modes and light levels for illuminating the wafer's edge with diffuse low angle light relative to the horizontal plane of the wafer's surface which may be particularly useful for taper width determination. By way of these light sources, the illumination subsystem may provide a variety of bright field and dark field illumination modes, and associated settings for illumination intensity, etc. Distinct combinations of these illumination parameter settings—modes, illumination levels, etc.—along with settings for exposure time, etc., may be associated with particular imaging modes and so may be optimized through the selection of the optimal imaging mode for a given wafer and/or particular azimuthal orientations. Oftentimes the lamps or flashes may be constructed from one or more light emitting diodes (LEDs), but other light-emitting materials may also be used. The light used to illuminate the wafer's edge may be substantially white light or it may be light limited to a certain visible spectral range. For example, in some embodiments employing a black-and-white/grayscale camera, red light may be used to illuminate the wafer's edge. Illumination sources which generate substantially red light have also found to work well with color cameras. In some embodiments, substantially blue light or green light as described with respect to various light sources above may also be useful. In addition to the described illumination methods above which direct light at the front plane of the wafer and features thereon, it is found that backlighting the wafer is particularly effective for producing a clear sharp edge image of the outer edge of the wafer. White and red diffuse backlighting have been found to be particularly suited to this application.

Settings for various post-processing parameters may also be associated with the imaging modes of the wafer edge imaging system, and may be optimized via the techniques described above to generate more useful imagery for process edge determination and measurement. For a wafer edge imaging system employing a color camera, examples of such post-processing parameters include parameters associated with various color filtration and enhancement functions that enhance the color values of red, green, blue, cyan, magenta, or yellow in an image through various mathematical transformations (multiplicative, additive, subtractive, combinations thereof, etc.), parameters associated with enhancement of hue, saturation, intensity again through various mathematical transformations, etc. These color enhancement functions may be applied uniformly over an entire image, or to particular sub-regions of an image, or selectively on a pixel-by-pixel basis. Adjusting the color hue of a wafer edge image has been found, in particular, to improve taper width determinations made with the image.

Specific examples of post-processing techniques and parameter selections which have been found to work well include:

Example 1: apply a filter to extract only the hue component of the color image and convert the resultant image to grayscale. (In some embodiments, single-component extraction may also be done with one of the RGB components or with a different HSI component. In some embodiments, a weighted-average of two or more components (such as two or more RGB components) may be used to convert to a grayscale image, or some other scheme of interpolating between multiple components may be employed. In some embodiments, the grayscale image may be generated from the luminescence of the color pixels.)

Example 2: apply a global pixel manipulation to the image by various image enhancing techniques including: thresholding, inversion of certain color pixel, histogram equalization to cut in or out certain sections of the color histogram for a region of interest. Then convert this image to grayscale using one or more techniques from Example 1.

Example 3: Convert each color pixel to grayscale as explained in Example 1, and then to either black or white based on predefined limits of conversion. For instance, in some embodiments, all grayscale values less than 75 and greater than 200 (assuming a scale of 0-255) are converted to white, and everything in between (75-200 on a scale of 0-255) are converted to black.

Example 4: Perform neighbor filtering in the region of interest to increase contrast. Neighbor filtering involves mathematically transforming/manipulating a pixel's value based on its value and the values of all pixels touching it (9 pixels in total). Appropriate mathematical transformations may include functions for shrinking or expanding values, smoothing functions, edge enhancement functions, and the like. In some embodiments, the result is to produce a grayscale image of greater contrast than the original color image over the region of interest. Neighbor filtering may be performed before or after conversion to grayscale (such as by the techniques set forth in Example 1) or it may be performed in embodiments not employing grayscale conversion.

Any of the foregoing examples (Examples 1-4) and any of the techniques set forth therein may be combined in any multitude of ways to process an image in order to improve the image's contrast. For example, the hue component extraction and grayscale conversion of Example 1 may be combined with any of the image processing techniques disclosed with respect to Examples 2-4.

Accordingly, the multiple imaging modes (which are evaluated to determine which generates images having the highest color contrast between pixels on either side of a process edge) may include distinct settings for color hue, and/or distinct settings for any parameter relevant to the foregoing post-processing techniques (as described in Examples 1-4). Of course, one having skill in the art will appreciate that, in some cases, what is referred to here as a post-processing technique, parameter, or mode could alternatively be employed during the image capture operation itself.

Figure 8:
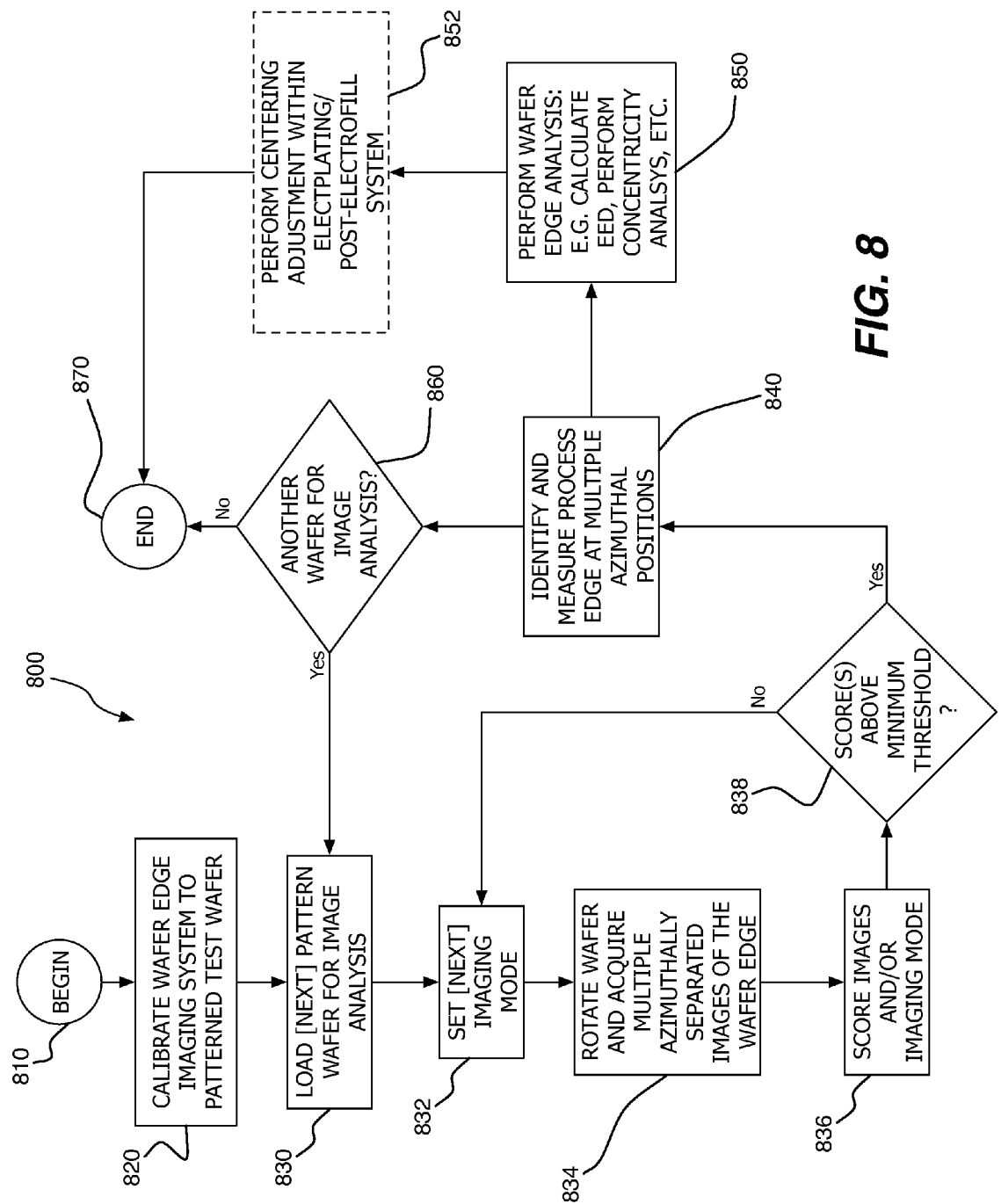
FIG. 8 presents a flowchart schematically illustrating a sequence of operations performed by various embodiments of the wafer edge imaging system and image optimization subsystem.

FIG. 8 presents a flowchart schematically illustrating a sequence of operations performed by various embodiments of the wafer edge imaging system and image optimization subsystem. The sequence of operations begins 810 with the calibration 820 of the wafer edge imaging system to a given class of patterned wafers. In some embodiments, this entails testing and setting the camera's position and angular orientation with respect to the wafer edge, as described above. After the imaging system is calibrated, the electroplating system or post-electrofill processing system may typically begin processing runs with production wafers. At some point during the processing of a production wafer, e.g., after electroplating, after EBR, etc., the wafer may be loaded 830 onto a rotatable substrate holder for imaging. As described above, in some embodiments, the rotatable substrate holder may be a dedicated substrate holder within the wafer edge imaging system (see FIG. 5), whereas in other embodiments, the substrate holder used to hold and rotate the wafer for image acquisition is the same as that used for holding the wafer during EBR within the EBR module (see FIG. 7). The imaging mode is set by the image optimization subsystem in step 832, and in step 834, the wafer is rotated and multiple azimuthally separated images of the wafer edge are acquired by the camera of the imaging system.

After acquisition the images are acquired, they are given a quality score in step 836, and in step 838 a determination is made by the image optimization system as to whether the images are of high enough quality to proceed with process edge identification and measurement in step 840. In some embodiments, image quality is determined to be of sufficient quality if the images' scores are above a minimum predetermined threshold as indicated in FIG. 8. If the scores are beneath the threshold, the image optimization system returns to step 832 and sets the camera in the next imaging mode. Multiple azimuthally separated images are then re-acquired 834, rescored 836, and so on, until in step 838 scores above the minimum threshold are achieved. Of course, in some embodiments, an imaging system may simply acquire all images using all of the preselected imaging modes first and afterwards have the image optimization subsystem determine which images and/or imaging modes are optimal.

Once a sufficient set of high-quality images are obtained at the multiple azimuthal positions, in step 840, the images are analyzed and the process edge of interest is identified and measured. In some embodiments, the process edge of interest is expected to be found within a certain range of radial values, as described above, and so part of the analysis is identifying the (hopefully unique) process edge which is within this radial range, and ignoring those that are not. In this manner, the process edge of interest is identified and measured, and from it an edge exclusion distance is calculated in step 850. A further aspect of step 850's wafer edge analysis is oftentimes a concentricity analysis as described above. In some embodiments, the results of the concentricity analysis may be used in step 852 to adjust the centering of the wafers being processed in one or more modules of the electroplating/post-electrofill processing system. Note that although various of the proceeding steps described with respect to the flowchart of FIG. 8 may be optional depending on the embodiment, the optional nature of a post-concentricity analysis centering adjustment is explicitly indicated by the dashed lined box representing step 852 in FIG. 8. As the wafer edge imaging system is performing wafer edge analysis 850 and optional centering adjustment 852, the system may contemporaneously determine whether another wafer is ready for image analysis in step 860, and proceed to load that wafer for image analysis thus returning to step 830. In this manner, the entire sequence of operations 830 through 840, 850, and 520 is repeated on a subsequent wafer. When all wafers have been imaged and analyzed the procedure is completed at step 870.

Controllers

The wafer edge image processing and analysis operations described herein, such as those operations described in reference to FIG. 8 above, may be implemented in program instructions which may reside on a controller of the wafer edge imaging system and/or image optimization subsystem and/or may reside on some remote non-transitory medium which is accessible from and readable by a controller associated with either or both of these systems. In some embodiments, the controller associated with the foregoing systems may represent one or more sub-components of a system controller which operates the entire electroplating system or post-electrofill processing system within which these image processing systems are integrated. In other embodiments, program instructions associated with the image processing and analysis operations disclosed herein may reside on the camera itself (in software or hardware) or on some other component distinct from the system controller which operates the electroplating and/or post-electrofill modules.

The controller which operates wafer edge imaging system may receiving feedback signals from various components, modules, subsystems, etc. of the apparatus and may supply control signals to the same or other components, modules, or subsystems. For instance, the controller may control operation of electroplating substrate holders, robots, cleaning systems, post-electrofill modules, etc. that are part of the electroplating or post-electrofill system. In certain embodiments, the controller may synchronize the operation of the various processing modules and the robots which move wafers between the various modules.

The controller may typically include one or more memory devices and one or more processors. The processor may include a central processing unit (CPU) or computer, analog and/or digital input/output connections, stepper motor controller boards, and other like components. Machine readable program instructions for implementing appropriate control operations are executed on the processor. The machine readable instructions may be stored on the memory devices associated with the controller or they may be provided over a network.

In certain embodiments, the controller controls all or most activities of the electroplating and/or post-electrofill processing systems described above including the operation of the wafer edge imaging systems described above. The controller executes system control software including sets of instructions for controlling the timing of the processing steps, pressure levels, gas flow rates, and other parameters of particular operations. Other computer programs, scripts, or routines stored on memory devices associated with the controller may be employed in some embodiments.

Typically, there is a user interface associated with the system controller. The user interface may include a display screen and graphical software to display process conditions, images of the wafer's edge which are acquired by the wafer edge imaging system, etc. Also included may be user input devices such as pointing devices, keyboards, touch screens, microphones, and other like components.

The computer program code for controlling the above operations can be written in any conventional computer readable programming language: for example, assembly language, C, C++, Pascal, Fortran or others. Compiled object code or script is executed by the processor to perform the tasks identified in the program.

Signals for monitoring processes may be provided by analog and/or digital input connections of the controller. The signals for controlling the processes are output on the analog and digital output connections of the controller.

Photolithographic Patterning

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or X-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

OTHER EMBODIMENTS

Although the foregoing disclosed processes, methods, systems, and apparatuses have been described in detail within the context of specific embodiments for the purpose of promoting clarity and understanding, it will be apparent to one of ordinary skill in the art that there are many alternative ways of implementing these processes, methods, systems, and apparatuses which are within the scope and spirit of this disclosure. Accordingly, the embodiments described herein are to be viewed as illustrative of the disclosed inventive concepts rather than limiting or restrictive, and are not to be used as an impermissible basis for unduly limiting the scope of the appended Claims.

We claim:

1. An electroplating system for forming a layer of metal on a substantially circular wafer having a side edge, the system comprising:
    an electroplating module comprising:
        a cell for containing an anode and an electroplating solution during electroplating; and
        a wafer holder for holding the wafer in the electroplating solution and rotating the wafer during electroplating;
    an edge bevel removal module, the edge bevel removal module comprising:
        a wafer holder for holding and rotating the wafer; and
        a device for delivering etchant to an edge bevel region of the wafer while the wafer is held and rotated on the wafer holder of the edge bevel removal module to remove electroplated metal from the edge bevel region after electroplating in the electroplating module; and
    a wafer edge imaging system comprising:
        a wafer holder for holding and rotating the wafer through different azimuthal orientations;
        a camera oriented for obtaining multiple azimuthally separated images of a process edge of the wafer while the wafer is held and rotated through different azimuthal orientations on the wafer holder of the imaging system, the process edge corresponding to the outer edge of the layer of metal formed on the wafer, wherein the camera is a color camera and each image generated by the color camera is represented as an array of pixels, each pixel comprising at least three color values; and
        image analysis logic for determining an edge exclusion distance from the multiple azimuthally separated images, wherein the edge exclusion distance is a distance between the wafer's side edge and the process edge, wherein the image analysis logic further comprises EBR detection logic for determining from the multiple azimuthally separated images whether or not edge bevel removal (EBR) has been performed on the wafer by the edge bevel removal module; and
    fault identification and reporting logic for reporting an error to an operator of the electroplating system when the image analysis logic determines that EBR has not been performed.

2. The electroplating system of claim 1, further comprising fault identification and reporting logic for reporting an error to an operator of the electroplating system when the image analysis logic determines that an edge exclusion distance is outside a predetermined range.

3. The electroplating system of claim 1, wherein the image analysis logic determines multiple azimuthally separated edge exclusion distances from the multiple azimuthally separated images, wherein each edge exclusion distance is a distance between the wafer's side edge and the process edge at a particular azimuthal angle.

4. The electroplating system of claim 3, wherein the image analysis logic further comprises concentricity analysis logic for determining that the wafer's side edge and imaged process edge are concentric when a metric indicative of a statistical variation in the multiple edge exclusion distances over different azimuthal angles is within a predetermined threshold value and non-concentric when the metric exceeds the threshold value.

5. The electroplating system of claim 4, wherein the metric is the standard deviation of the edge exclusion distances over different azimuthal angles.

6. The electroplating system of claim 4, further comprising wafer centering adjustment logic for adjusting centering of one or more subsequently processed wafers within the electroplating module when a determination is made that a currently imaged wafer's side edge and process edge are non-concentric.

7. The electroplating system of claim 4, further comprising fault identification and reporting logic for reporting an error to an operator of the electroplating system when the concentricity analysis logic determines that an imaged wafer's side edge and process edge are non-concentric.

8. The electroplating system of claim 1, wherein the image analysis logic further comprises sharpness analysis logic for analyzing images of the process edge and determining a sharpness of the process edge in the images.

9. The electroplating system of claim 1:
wherein the wafer edge imaging system is configured to operate in multiple imaging modes and to obtain multiple azimuthally separated images of the process edge using the multiple imaging modes; and
wherein the wafer edge imaging system further comprises an image optimization subsystem for determining an imaging mode which generates images of the process edge that are sharpest, and selecting the images generated using the imaging mode which generates images of the process edge that are sharpest for use by the image analysis logic to determine an edge exclusion distance.

10. The electroplating system of claim 9, wherein the wafer edge imaging system includes an illumination subsystem having a light source with adjustable illumination intensity, and wherein the multiple imaging modes comprise distinct combinations of settings for illumination intensity and exposure times.

11. The electroplating system of claim 1, wherein the wafer edge imaging system further comprises an illumination subsystem having a diffuse light source for illuminating the wafer's side edge with light comprising either diffuse low angle light or diffuse on-axis light relative to a horizontal plane of a surface of the wafer.

12. The electroplating system of claim 1, wherein the image analysis logic further comprises logic for determining a taper width of the process edge from the multiple azimuthally separated images.

13. The electroplating system of claim 1, the camera is a color camera.

14. The electroplating system of claim 13, wherein each of the images generated by the color camera is represented as an array of pixels, each pixel comprising at least three color values.

15. The electroplating system of claim 14, wherein in the multiple azimuthally separated images, the process edge is identified as a narrow region having the greatest color contrast between adjacent pixels.

16. The electroplating system of claim 15:
wherein the image analysis logic further comprises logic for determining a taper width of the process edge from the multiple azimuthally separated images;
wherein the wafer edge imaging system is configured to operate in multiple imaging modes and to obtain multiple azimuthally separated images of the process edge using the multiple imaging modes; and
wherein the wafer edge imaging system further comprises an image optimization subsystem for determining an imaging mode which generates images of the process edge having the highest color contrast between pixels on either side of the process edge, and selecting the images generated using the imaging mode which generates images of the process edge having the highest color contrast between pixels on either side of the process edge for use by the image analysis logic to determine the taper width.

17. The electroplating system of claim 16:
wherein the wafer edge imaging system further comprises an illumination subsystem having a diffuse light source for illuminating the wafer's side edge with diffuse low angle light relative to a horizontal plane of a surface of the wafer; and
wherein the wafer edge imaging system's multiple imaging modes comprises distinct combinations of settings for illumination intensity, and exposure times.

18. The electroplating system of claim 17, wherein the multiple imaging modes further comprise distinct settings for color hue, saturation, and intensity.

19. The electroplating system of claim 1, wherein the wafer holder of the wafer edge imaging system is the wafer holder of the edge bevel removal module.

20. The electroplating system of claim 1, wherein the EBR detection logic determines whether or not EBR has been performed based on a difference between one or more of the three color values measured by the color camera at one or more pixels measured near the side edge of the wafer and one or more stored reference color values indicative of a color at a point on a wafer where a metal layer isn't present.

21. The electroplating system of claim 20, wherein the metal is copper.

22. The electroplating system of claim 1, wherein the process edge, of which the edge exclusion distance is determined in reference, is chosen for analysis by the image analysis logic based on the process edge's location within a predetermined radial range inward from the wafer's side edge.

23. A method of processing a substantially circular wafer comprising:
performing a processing operation on the wafer which forms a process edge of the wafer;
rotating the wafer through multiple azimuthal orientations;
obtaining multiple azimuthally separated color images of the process edge of the wafer while the wafer is rotated through the multiple azimuthal orientations, wherein each image generated by the color camera is represented as an array of pixels, each pixel comprising at least three color values;
identifying the process edge of the wafer in the multiple azimuthally separated images as a region having high contrast between adjacent pixels in the images;
determining an edge exclusion distance from the multiple azimuthally separated images by comparing the identified process edge with a side edge of the wafer appearing in the images;
determining from the multiple azimuthally separated images whether or not edge bevel removal (EBR) has been performed on the wafer by an edge bevel removal module, wherein the edge bevel module comprises a wafer holder for holding and rotating the wafer and a device for delivering etchant to an edge bevel region of the wafer while the wafer is held and rotated on the wafer holder of the edge bevel removal module to remove electroplated metal from the edge bevel region; and reporting that the edge exclusion distance is outside a predetermined range.

24. The method of claim 23, wherein the processing operation is electroplating.

25. The method of claim 23, wherein the processing operation is edge bevel removal.

26. The method of claim 23, wherein determining from the multiple azimuthally separated images whether or not edge bevel removal (EBR) has been performed on the wafer by an edge bevel removal module is based on based on a difference between one or more of the three color values measured by the color camera at one or more pixels measured near the side edge of the wafer and one or more stored reference color values indicative of a color at a point on a wafer where a metal layer isn't present.

27. The method of claim 26, wherein the metal is copper.

\* \* \* \* \*